United States Patent
Xie et al.

(10) Patent No.: US 11,621,332 B2
(45) Date of Patent: Apr. 4, 2023

(54) WRAPAROUND CONTACT TO A BURIED POWER RAIL

(71) Applicant: International Business Machines Corporation, Armonk, NY (US)

(72) Inventors: Ruilong Xie, Niskayuna, NY (US); Veeraraghavan S. Basker, Schenectady, NY (US); Alexander Reznicek, Troy, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 17/148,911

(22) Filed: Jan. 14, 2021

(65) Prior Publication Data

US 2022/0223698 A1 Jul. 14, 2022

(51) Int. Cl.
| | |
|---|---|
| *H01L 29/417* | (2006.01) |
| *H01L 23/535* | (2006.01) |
| *H01L 29/786* | (2006.01) |
| *H01L 29/423* | (2006.01) |
| *H01L 29/40* | (2006.01) |
| *H01L 21/8234* | (2006.01) |
| *H01L 23/528* | (2006.01) |

(52) U.S. Cl.
CPC ........... *H01L 29/41733* (2013.01); *H01L 21/823475* (2013.01); *H01L 23/5286* (2013.01); *H01L 23/535* (2013.01); *H01L 29/401* (2013.01); *H01L 29/42392* (2013.01); *H01L 29/78696* (2013.01)

(58) Field of Classification Search
CPC .................. H01L 23/535; H01L 23/5286
See application file for complete search history.

(56) References Cited

U.S. PATENT DOCUMENTS

| | | | |
|---|---|---|---|
| 9,570,395 B1 | 2/2017 | Sengupta | |
| 10,453,850 B2 | 10/2019 | Smith | |
| 10,475,692 B2 | 11/2019 | Licausi | |
| 2018/0374791 A1 | 12/2018 | Smith | |
| 2019/0080969 A1 | 3/2019 | Tsao | |
| 2019/0288004 A1 | 9/2019 | Smith | |
| 2020/0135644 A1* | 4/2020 | Lin | H01L 23/528 |
| 2020/0373331 A1* | 11/2020 | Kim | H01L 23/535 |
| 2021/0375722 A1* | 12/2021 | Kim | H01L 21/823431 |

* cited by examiner

*Primary Examiner* — Farun Lu
(74) *Attorney, Agent, or Firm* — Edward J. Wixted, III

(57) ABSTRACT

An approach to form a semiconductor structure with a buried power rail. The semiconductor structure includes a buried power rail in a semiconductor substrate where a buried contact contacts to a first portion of a top surface of the buried power rail to a source/drain of a semiconductor device. Additionally, the semiconductor structure includes a first portion of a top surface of the buried contact that is below a top surface of the source/drain of the semiconductor device and a portion of a bottom surface of the buried contact that is in a cavity formed in the source/drain of the semiconductor device.

19 Claims, 20 Drawing Sheets

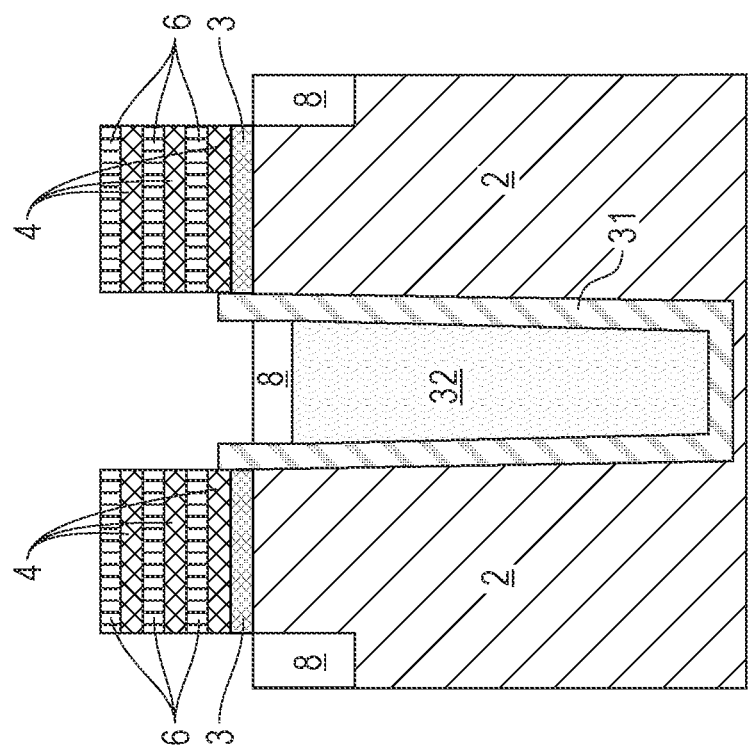
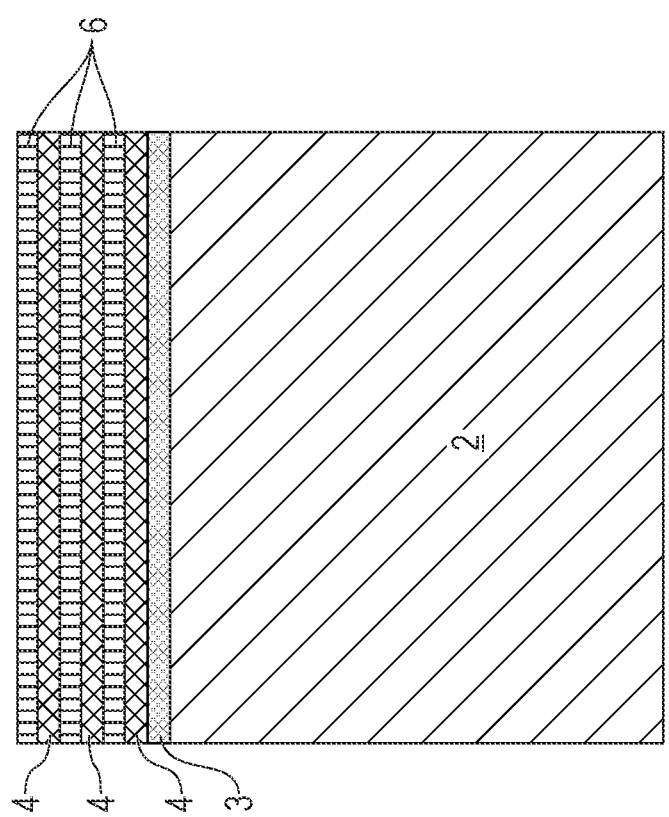
FIG. 4B
FIG. 4A

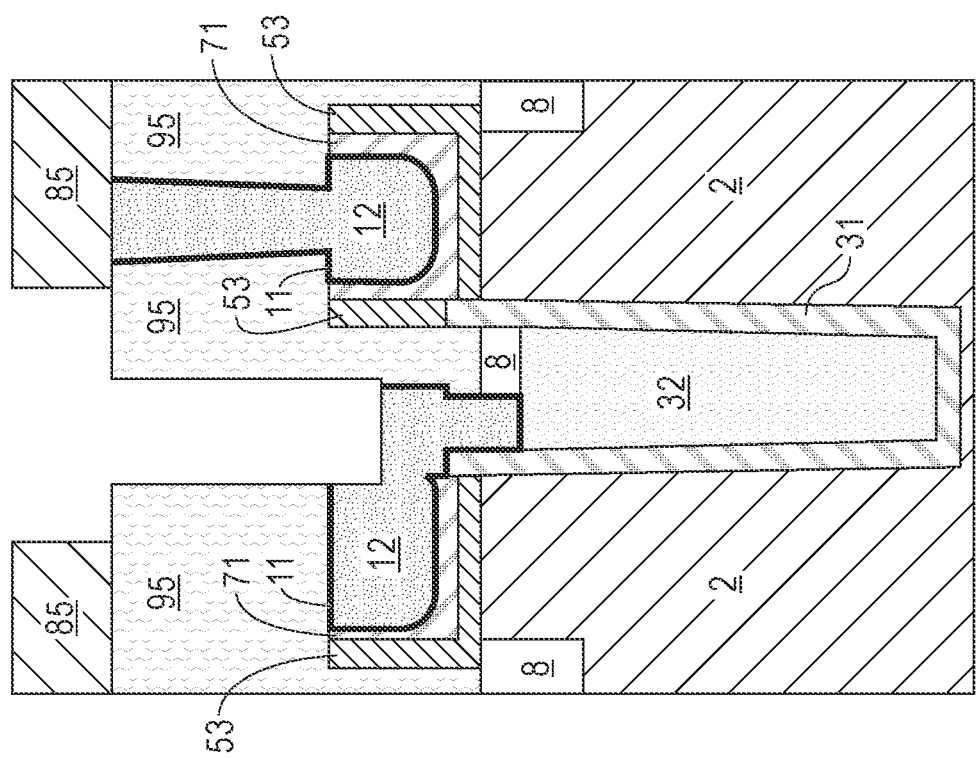

US 11,621,332 B2

WRAPAROUND CONTACT TO A BURIED POWER RAIL

BACKGROUND OF THE INVENTION

The present invention relates generally to the field of semiconductor device manufacture and more particularly to the formation of buried power rails for semiconductor devices.

Semiconductor device manufacturing and device design are continually packaging more circuits into semiconductor chips as line widths and spacing between device elements shrink in the nanoscale range. Typically, transistors are formed on the semiconductor substrate and are connected together by layers of interconnects and power structures formed above the transistors. Conventional power rails, commonly used with memory devices such as static-random access memory (SRAM), typically reside in the interconnect layers above the transistors. Conventional power rails in interconnect layers consume a significant amount of area reducing area available for other interconnections. Conventional power rails can create congestion in the interconnection layers reducing space for other wires and connections.

In order to free area in the interconnect wiring, power rails can be moved down into the semiconductor substrate to form buried power rails. With buried power rails in the semiconductor substrate, power rails in the interconnect layers are no longer required and area used for power rails in the interconnect layers is now available for other wiring needs. Reduced congestion in interconnect wiring layers due to the removal of power rails can provide additional area for wiring and/or larger wires and space for improved electrical performance.

SUMMARY

Embodiments of the present invention disclose a semiconductor structure with a buried power rail. The structure includes a buried power rail in a semiconductor substrate where a buried contact contacts to a first portion of a top surface of the buried power rail to a source/drain of a semiconductor device. Additionally, the semiconductor structure includes a first portion of a top surface of the buried contact that is below a top surface of the source/drain of the semiconductor device and a portion of a bottom surface of the buried contact that is in a cavity formed in the source/drain of the semiconductor device.

Embodiments of the present invention provide a method of forming a buried contact connecting to a buried power rail in semiconductor substrate. The method includes forming a first protective spacer adjacent to a buried power rail and depositing a dielectric layer on the buried power rail. The method includes forming a second protective spacer along a side of a gate spacer and depositing a layer of an optical planarization material over the semiconductor structure. The method includes etching the optical planarization material to expose a portion of the source/drain epi and a portion of the buried power rail. Additionally, the method includes selectively etching a portion of the first protective spacer adjacent to the buried power and removing a top portion of the source/drain epi to form an L-shaped cavity in the source/drain epi. The method includes depositing a buried contact on an inner surface of the L-shaped cavity of the source/drain epi and removing a portion of the wraparound contact that is over the buried power rail.

BRIEF DESCRIPTION OF THE DRAWINGS

The above and other aspects, features, and advantages of various embodiments of the present invention will be more apparent from the following description taken in conjunction with the accompanying drawings.

FIG. 4A depicts a cross-sectional view of section A-A of a fourth semiconductor structure after fabrication steps depositing a dielectric material, planarize, recess STI, and remove hardmask, in accordance with an embodiment of the present invention.

FIG. 4B depicts a cross-sectional view of section B-B of the fourth semiconductor structure after fabrication steps depositing a dielectric material, planarize, recess STI, and remove hardmask, in accordance with an embodiment of the present invention.

FIG. 18 depicts a cross-sectional view of section B-B of the eighteenth semiconductor structure after fabrication steps depositing an OPL layer, patterning the OPL layer, and removing a portion of a contact metal, in accordance with an embodiment of the present invention.

DETAILED DESCRIPTION

Figure 1:
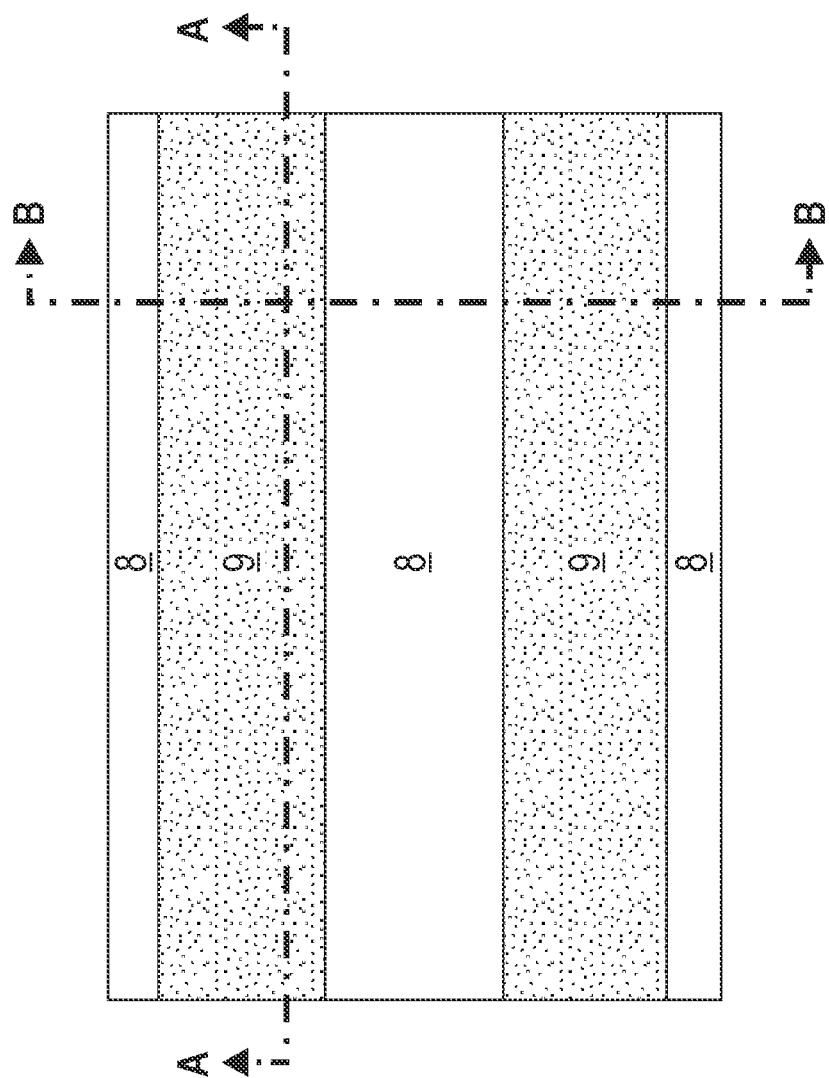
FIG. 1 depicts a top view of a first semiconductor structure illustrating locations of section A-A and section B-B, in accordance with an embodiment of the present invention.

Embodiments of the present invention recognize that there is a need for increasing available wiring area in the interconnect wiring layers of a semiconductor chip. Embodiments of the present invention recognize that using a buried power rail reduces congestion in the interconnection wiring layers however, congested wiring issues such as contact epi tight spacing and high contact epi to gate parasitic capacitance are present with conventional buried power rails.

Embodiments of the present invention provide a method for forming a wraparound buried contact to a buried power rail where the buried contact fills or wraps around a cavity in the source/drain of a semiconductor device. Embodiments of the present invention provide a new semiconductor structure for the wraparound buried contact connecting the source/drain epi of a semiconductor device, such as a transistor, to a buried power rail. Embodiments of the present invention provide a wraparound buried contact filling an L-shaped cavity in a source/drain that connects to the buried power rail in the semiconductor substrate. Embodiments of the present invention the wraparound buried contact in the L-shaped cavity of the source/drain provides more space between adjacent buried contacts in adjacent U-shaped source/drains. Additionally, in embodiments of the present invention, a portion of the wraparound buried contact adjacent to a U-shaped source/drain and above a portion of the buried power rail is removed thereby creating more space between the buried contact in the L-shaped source/drain and adjacent buried contacts. Embodiments of the present invention remove a rectangular portion of the buried contact that is above the buried power rail to selectively reduce the size of the wraparound buried contact and thereby, reduce the capacitance and improve electrical performance of the wraparound buried contact.

Embodiments of the present invention provide a method of forming a wraparound buried contact that protects the gate spacer or gate cap during reactive ion etch of optical planarization layer and interlayer dielectric over the sacrificial dielectric materials in the source/drain cavities and over the buried power rail. The method provides protection to gate spacers using an early spacer pull down to access sacrificial material in source/drain epi cavities without damaging gate spacer (e.g., gate cap). Furthermore, the method includes depositing a liner around the buried power rail that extends above the top surface of the semiconductor structure to a side of the source/drain epi allowing electrical contact with the source/drain epi while preventing connection of the wraparound buried contact to the semiconductor substrate.

Embodiments of the present invention provide a method of forming a wraparound buried contact connecting to a buried power rail with improved contact capacitance by forming wraparound buried contact in source/drain cavities using multiple protective spacers around dummy gates and the replacement metal gate structures. The method includes removing a portion of the wraparound buried contact above the buried power rail. The method of forming the wraparound buried contact provides more space between source/drains than traditional buried vias or traditional buried contacts. Traditional buried contacts or vias connect a top surface of a buried power rail to a bottom surface of the contact epi or trench silicide formed over a traditional source/drain. Embodiments of the present invention form the wraparound buried contact in cavities formed in the source/drains and extend down from a side edge of the source/drain to a portion of the top surface of the buried power rail recessed below the top surface of the semiconductor substrate.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a top view of the first semiconductor structure, in accordance with an embodiment of the present invention. As depicted FIG. 1 illustrates a section A-A on the top view of the first semiconductor structure and a section B-B on the top view of the first semiconductor structure. FIG. 1 is a top view of shallow trench isolation (STI) 8 and hardmask 9. Section A-A of subsequent semiconductor structures (e.g., the second semiconductor structure, the third semiconductor structure, etc.) while be depicted in FIGS. 1A-19A. Section B-B of subsequent semiconductor structures can be depicted in FIGS. 1B-19B.

Figure 1B:
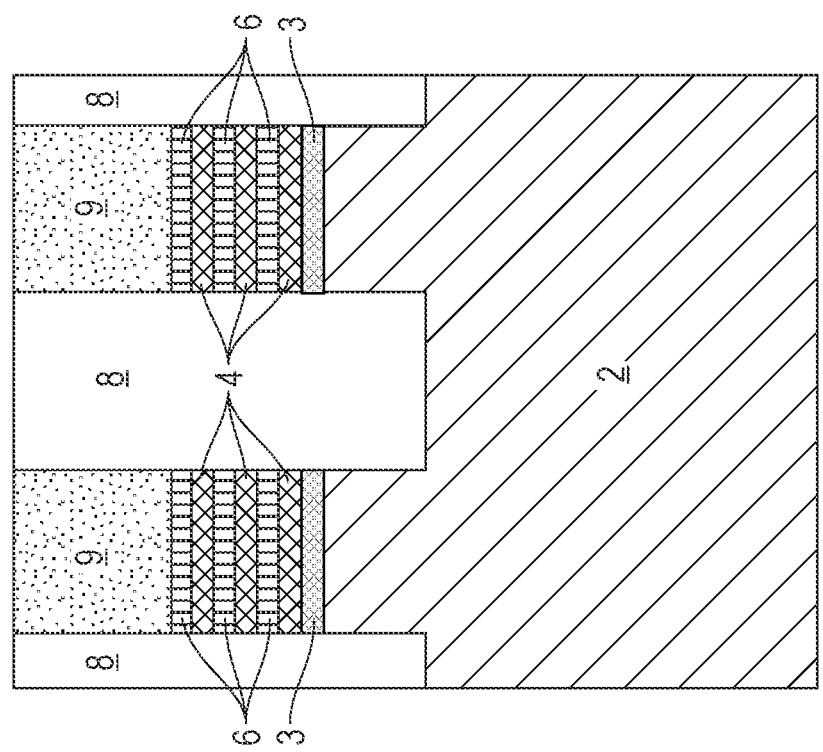
FIG. 1B depicts a cross-sectional view of section B-B of the first semiconductor structure perpendicular to FIG. 1A, in accordance with an embodiment of the present invention.
Figure 1A:
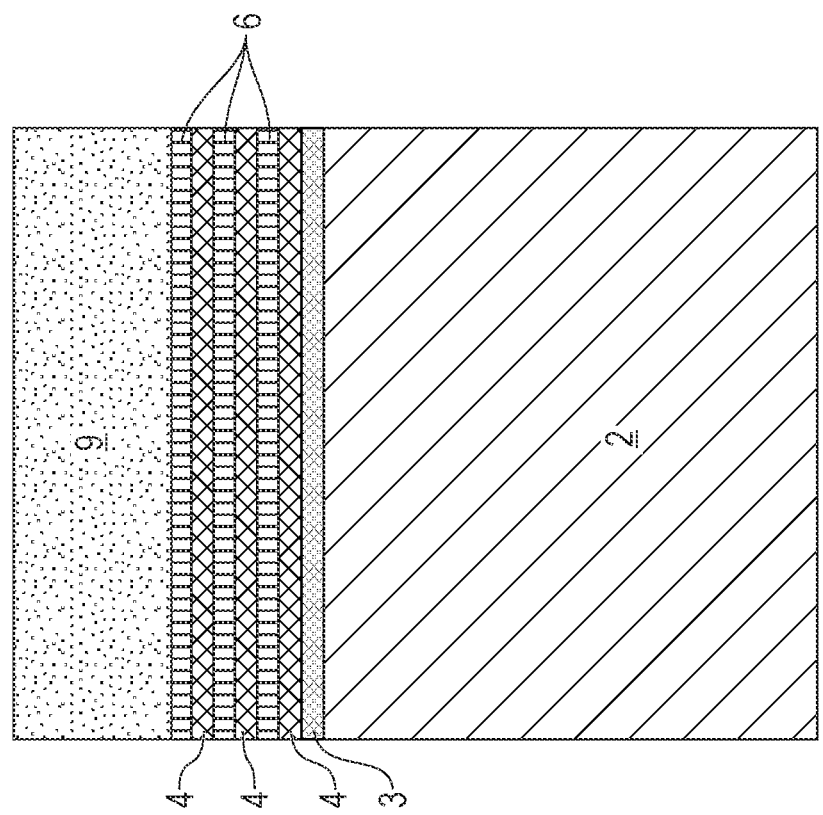
FIG. 1A depicts a cross-sectional view of section A-A of the first semiconductor structure with a top hardmask layer over a nanosheet stack of alternating semiconductor layers, in accordance with an embodiment of the present invention.

FIG. 1A depicts a cross-sectional view of the first semiconductor structure with hardmask 9 over a nanosheet stack of alternating semiconductor layers, in accordance with an embodiment of the present invention. As depicted in FIG. 1A includes substrate 2, a nanosheet stack composed of a bottom sacrificial layer 3 and a stack of alternating layers of semiconductor layer 4 and semiconductor layer 6. In various embodiments, a top layer of semiconductor layer 6 of the nanosheet stack is covered by hardmask 9. While depicted in FIG. 1A as three layers of alternating semiconductor layer 4 and 6, in other embodiments more less layers may be present in the nanosheet stack.

Substrate 2 is composed of any semiconductor substrate material suitable for forming one or more semiconductor devices with a buried power rail (BPR). In various embodiments, semiconductor substrate 2 is composed of one of any group III-V semiconductor material, group II-VI semiconductor material, or group IV semiconductor material such as silicon of silicon germanium. In other examples, substrate 2 may be composed of materials including, for example, III-V compound semiconductor materials (e.g., SiC, GaAs, or InAs), ZnTe, CdTe, ZnCdTe, or other II-VI compound semiconductor materials or alloys of GaAlAs, InGaAs, InAlAs, InAlAsSb, InAlAsP, and InGaAsP. In various embodiments, substrate 2 is a wafer or a portion of a wafer. In some embodiments, substrate 2 includes one or more of doped, undoped, or contains doped regions, undoped regions, or defect rich regions. In an embodiment, substrate 2 is one of a layered semiconductor substrate, such as a semiconductor-on-insulator substrate (SOI) or silicon-on-replacement insulator (SRI).

In various embodiments, a nanosheet stack below hardmask 9 includes semiconductor layer 4 composed of $SiGe_{30}$ and semiconductor layer 6 composed of Si. In other embodiments, semiconductor layer 4 and semiconductor layer 6 in the nanosheet strack are composed of other semiconductor materials. such as SiGe and III-V semiconductor layers but are not limited to these materials. While FIG. 1A illustrates two different semiconductor materials in the nanosheet stack, the nano sheet stack is not limited to two different semiconductor materials. In another example, three different materials can be used in the nanosheet stack.

In various embodiments, sacrificial layer 3 is under the bottom layer of semiconductor layer 6 in the nanosheet stack. In some embodiments, sacrificial layer 3 is a part of the nanosheet stack. Sacrificial layer 3 can be composed of $SiGe_{60}$ but, is not limited to this material. The nanosheet stack, formed using known semiconductor processes, is covered by hardmask 9 which can be any hardmask material used in semiconductor device formation. A chemical-mechanical polish (CMP) of the top surface of the first semiconductor structure may occur.

FIG. 1B depicts a cross-sectional view of the first semiconductor structure perpendicular to FIG. 1A, in accordance with an embodiment of the present invention. As depicted FIG. 1B includes substrate 2, semiconductor layer 4, semiconductor layer 6, sacrificial layer 3, hardmask 9 and STI 8 after a CMP of the first semiconductor structure. The plurality of isolation structures, depicted as STI 8 can be composed of any dielectric material suitable for isolation trench formation (e.g., $SiO_2$). STI 8, as depicted, bisect hardmask 9, the nanosheet stack (e.g., semiconductor layers 4 and 6 and sacrificial layer 3), and a top portion of semiconductor substrate 2. While depicted as three STI 8, a number of STI 8 are not limited to this number.

Figure 2B:
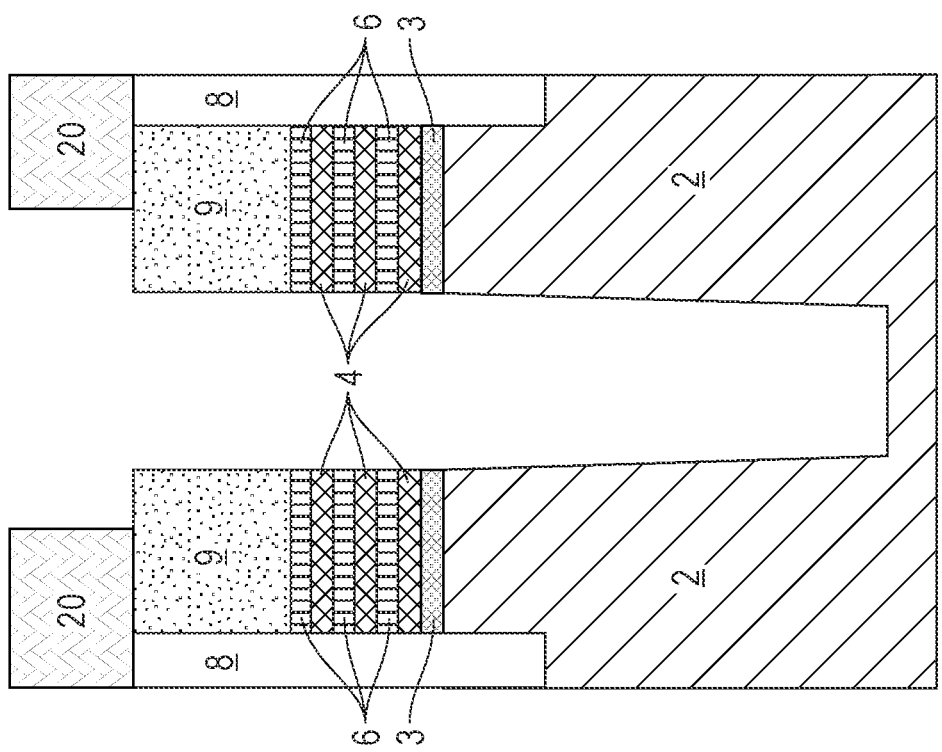
FIG. 2B depicts a cross-sectional view of section B-B of the second semiconductor structure after fabrication steps depositing an OPL and etching a trench for creating a buried power rail, in accordance with an embodiment of the present invention.
Figure 2A:
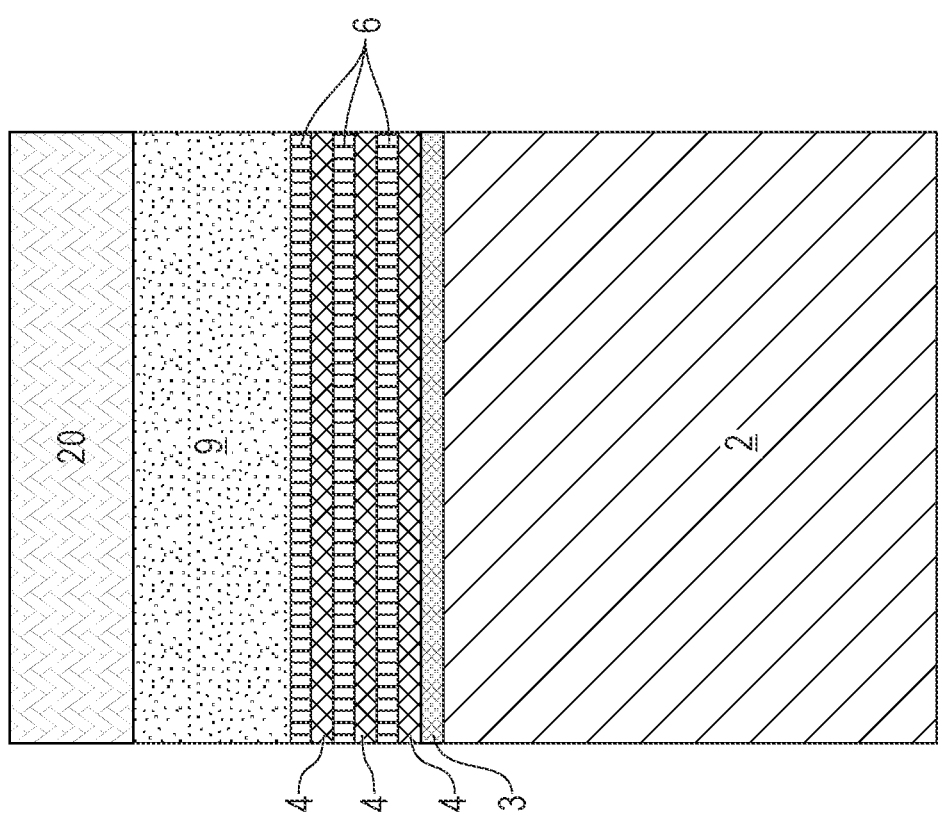
FIG. 2A depicts a cross-sectional view of section A-A of a second semiconductor structure after fabrication steps depositing an optical planarization layer (OPL) on the hardmask, in accordance with an embodiment of the present invention.

FIG. 2A depicts a cross-sectional view of section A-A of the second semiconductor structure after fabrication steps depositing OPL 20 on hardmask 9, in accordance with an embodiment of the present invention. A layer of OPL 20 is deposited on hardmask 9 by conventional methods such as spin-on-coating. A trench (not depicted in this view) is formed for buried power rail deposition by patterning the OPL and underneath STI 8 using lithography and etching process.

FIG. 2B depicts a cross-sectional view of section B-B of the second semiconductor structure after fabrication steps depositing OPL 20 on hardmask 9 and etching a trench used for creating a buried power rail, in accordance with an embodiment of the present invention. FIG. 2B includes depositing OPL 20 and forming a trench in the second semiconductor structure using known self-aligning techniques for BPR formation. In various embodiments, reactive ion etch (RIE) through a portion of OPL 20, one of STI 8, and a portion of substrate 2 occurs. In some embodiments, a portion of sides of the nanosheet stack (e.g., semiconductor layers 3, 4, and 6) adjacent to the removed STI 8 are also removed.

Figure 3B:
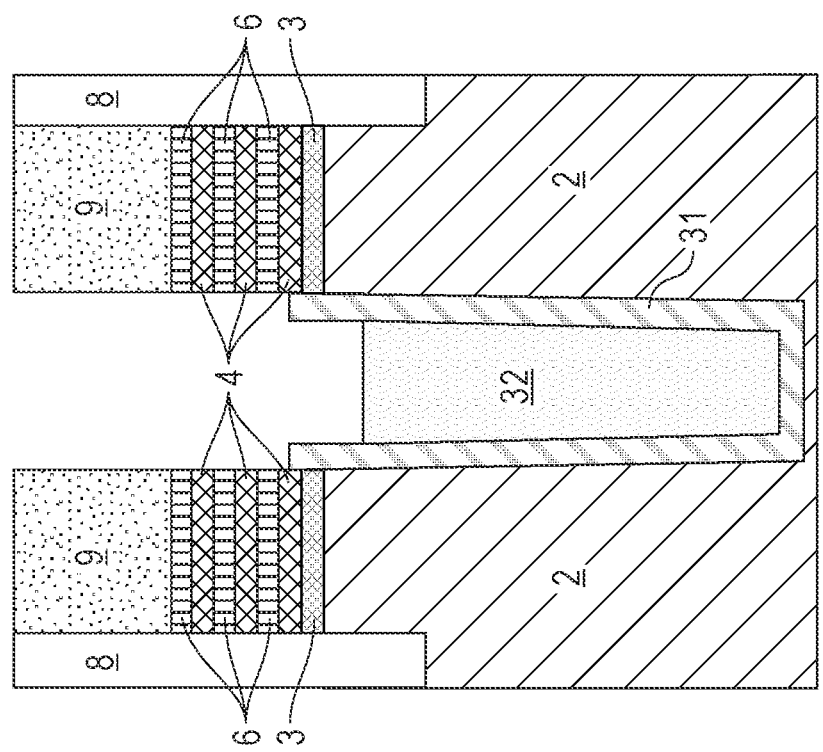
FIG. 3B depicts a cross-sectional view of section B-B of the third semiconductor structure after fabrication steps depositing a liner and buried power rail (BPR) and removing a portion of the liner and a portion of the BPR, in accordance with an embodiment of the present invention.
Figure 3A:
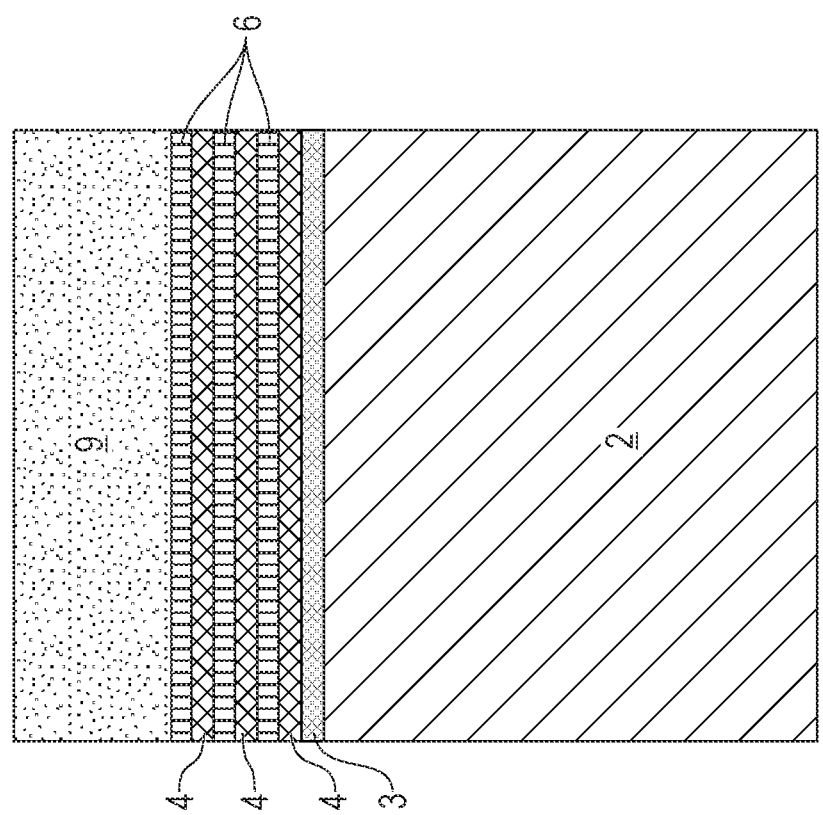
FIG. 3A depicts a cross-sectional view of section A-a of a third semiconductor structure after fabrication steps depositing a liner and buried power rail (BPR) and removing a portion of the liner and a portion of the BPR, in accordance with an embodiment of the present invention.

FIG. 3A depicts a cross-sectional view of section A-A of the third semiconductor structure after fabrication steps depositing a buried power rail (BPR) liner 31 (not depicted in this view) and BPR 32 (not depicted in this view) and removing a portion of BPR liner 31 and BPR 32, in accordance with an embodiment of the present invention. Section A-A of the third semiconductor structure is substantially the same as cross-sectional view of the second semiconductor structure depicted in FIG. 2A.

FIG. 3B depicts a cross-sectional view of section B-B of the third semiconductor structure after fabrication steps depositing BPR liner 31 and BPR 32 and removing a portion of BPR liner 31 and BPR 32, in accordance with an embodiment of the present invention. In FIG. 3B, BPR liner 31 is deposited using known semiconductor processes. In various embodiments, BPR liner 31 is composed of a dielectric material. For example, BPR liner 31 can be SiCO. BPR 32 is deposited over BPR liner 31 to fill the trench. BPR 32 can be composed of any material used in a buried power rail (e.g., a metal material of known resistance, such as, W, Ru, Cu, Co, Al, with additional adhesion liner such as TiN, TaN, etc.). A CMP can remove a top portion of BPR liner 31 and BPR 32 from the top surface of the third semiconductor structure. In various embodiments, a first etch of BPR 32 removes a top portion of BPR 32 until a top surface of BPR 32 is below a top surface of semiconductor substrate 2. A second etch removes an exposed portion of BPR liner 31 from hardmask 9 and from a portion of the nanosheet stack in the trench (e.g., from side edges of some of semiconductor layers 4 and 6) as shown in FIG. 3B. After that, a second selective etch removes an additional portion of BPR 32 such that the top surface of BPR 32 is below a top surface or edge of BPR liner 31 in the trench.

FIG. 4A depicts a cross-sectional view of section A-A of the fourth semiconductor structure after fabrication steps depositing a dielectric material, planarize, removing dielectric material in the trench, recessing STI (the preceding steps are not depicted in this view), and removing hardmask 9, in accordance with an embodiment of the present invention. In section A-A, FIG. 4A depicts the nanosheet stack on substrate 2 after removing hardmask 9.

FIG. 4B depicts a cross-sectional view of section B-B of the fourth semiconductor structure after fabrication steps depositing a dielectric material (e.g., depositing additional STI 8 material), planarize, removing a portion of each STI 8, recessing BPR 32, and removing hardmask 9, in accordance with an embodiment of the present invention. In section B-B, FIG. 4B depicts substrate 2, BPR liner 31, BPR 32, STI 8, sacrificial layer 3, and the nanosheet stack composed of alternating layers of semiconductor layers 4 and 6 on substrate 2. Another layer of STI 8 (e.g., dielectric material) is deposited over the third semiconductor structure, filling at least a portion of the trench above BPR 32 and BPR liner 31. A CMP can be performed to remove the top portion of STI 8. An etch of the top portions of the remaining STI 8 occurs using known dielectric material etch processes in order to recess the top surfaces of STI 8 below the top surface of BPR liner 31 as depicted in FIG. 4B.

Figure 5B:
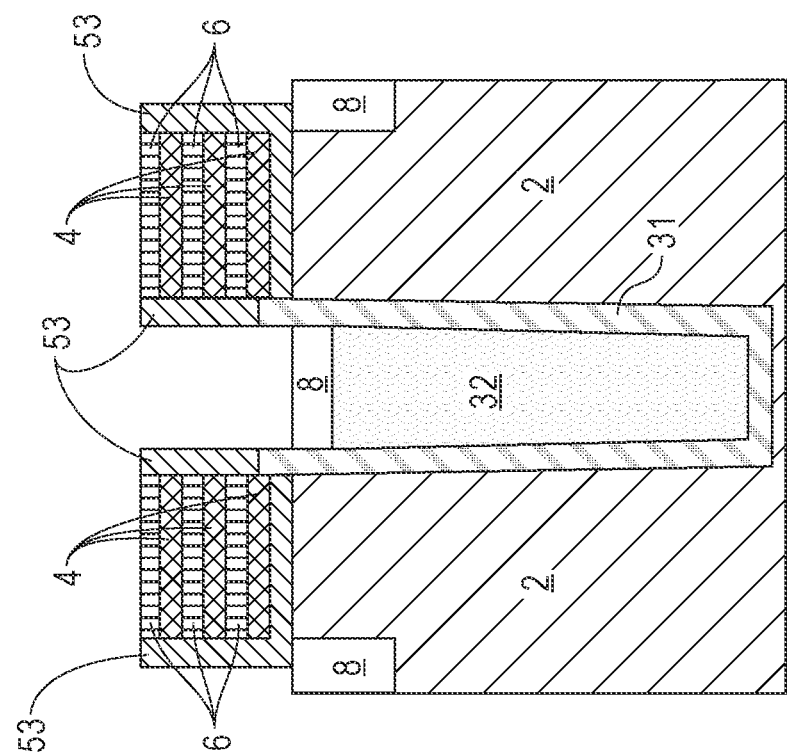
FIG. 5B depicts a cross-sectional view of section B-B of the fifth semiconductor structure after fabrication steps forming a dummy gate structure and spacers, in accordance with an embodiment of the present invention.
Figure 5A:
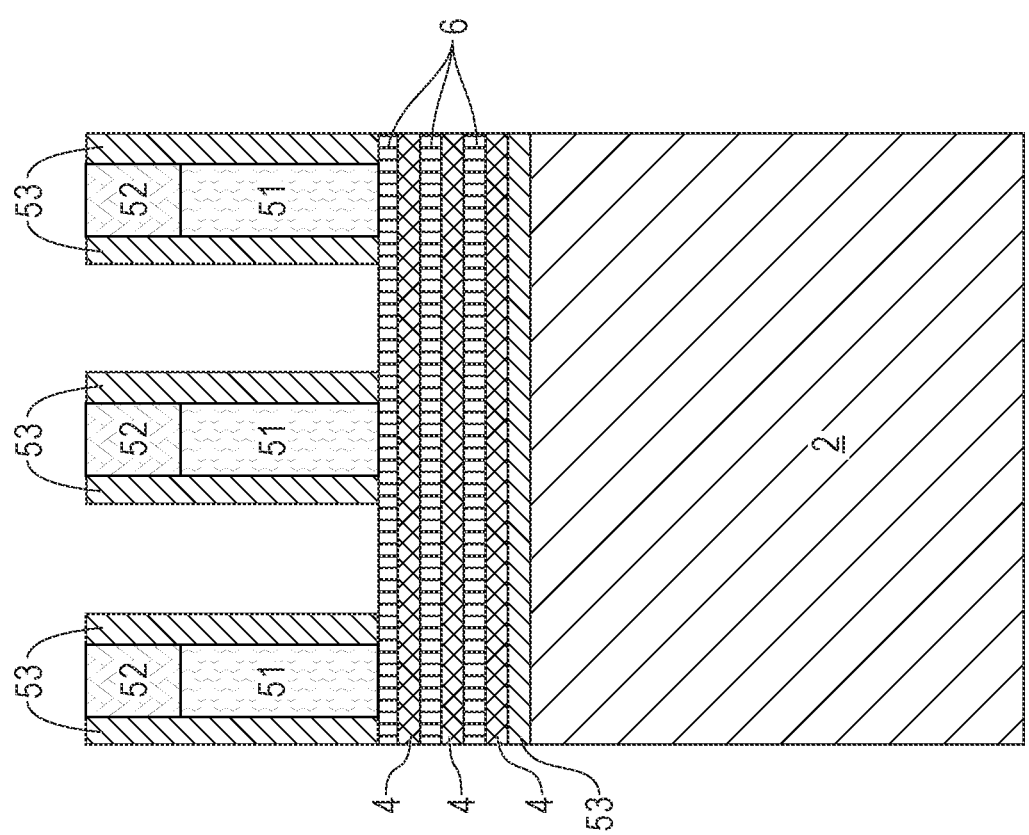
FIG. 5A depicts a cross-sectional view of section A-A of a fifth semiconductor structure after fabrication steps forming a dummy gate structure and spacers, in accordance with an embodiment of the present invention.

FIG. 5A depicts a cross-sectional view of section A-A of the fifth semiconductor structure after fabrication steps forming dummy gate structures and spacer 53, in accordance with an embodiment of the present invention. Using known semiconductor processes and materials for dummy gate structure formation, a plurality of dummy gate structures composed of dummy gate 51, hardmask 52, and spacer 53 can be formed on the top surface of the fifth semiconductor structure. In various embodiments, the dummy gate structures extend in a perpendicular direction to BPR 32. While three dummy gate structures are formed in FIG. 5A any number of dummy gate structures may be formed.

FIG. 5B depicts a cross-sectional view of section B-B of the fifth semiconductor structure after fabrication steps forming dummy gate structures (not depicted in this view) and spacer 53, in accordance with an embodiment of the present invention. In various embodiments, after dummy gate structure formation (not depicted in this view) sacrificial layer 3 is removed under the nanosheet stack. Sacrificial layer 3 under a bottom layer of the nanosheet stack (e.g., under bottom semiconductor layer 4) can be removed, for example, using a selective dry etch, such as vapor phased HCl at aa appropriate temperature.

In various embodiments, a layer of a spacer material is conformally deposited over exposed surfaces of the fifth semiconductor structure including under the nanosheet stack, on the sides of the nanosheet stack, on the top surface of BPR liner 31, and on the dummy gate structures (not depicted in this view). Spacer 53 can be composed of any known semiconductor dielectric spacer material, such as SiN, SiOCN, SiBCN, SiOC, or the like. In various embodiments, an anisotropic etch process, such as an anisotropic wet etch or RIE removes spacer 53 from the top, horizontal surfaces of the semiconductor structure resulting in the fifth semiconductor structure.

Figure 6B:
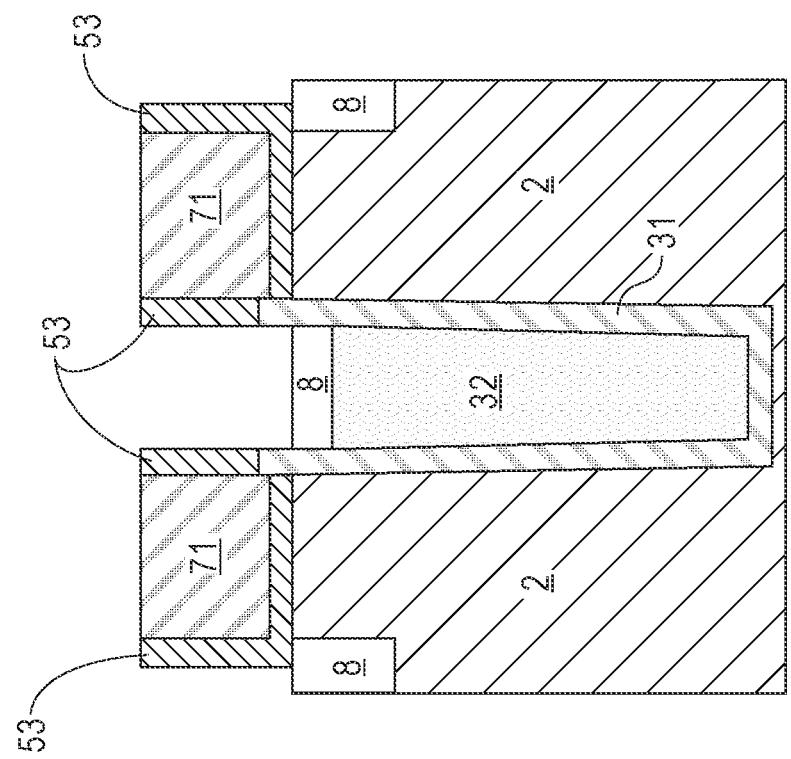
FIG. 6B depicts a cross-sectional view of section B-B of the sixth semiconductor structure after fabrication steps removing a portion of the nanosheet stack, forming inner spacers, and forming source/drains (S/Ds), in accordance with an embodiment of the present invention.
Figure 6A:
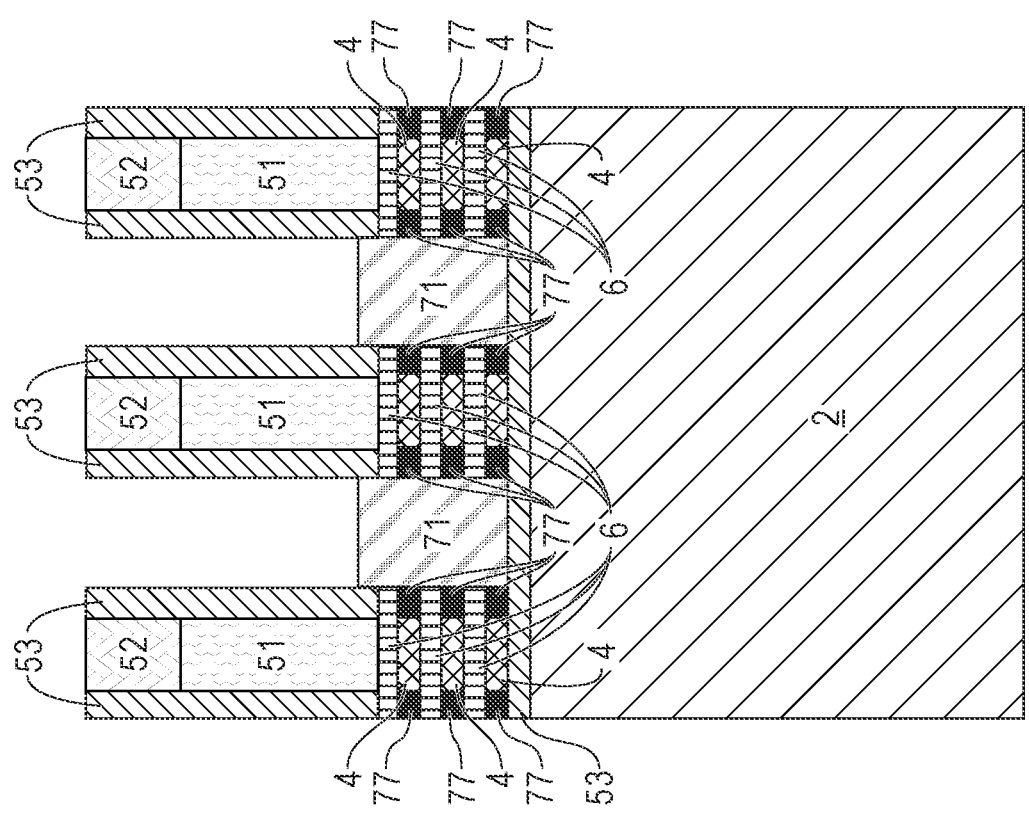
FIG. 6A depicts a cross-sectional view of section A-a of a sixth semiconductor structure after fabrication steps removing a portion of the nanosheet stack, forming inner spacers, and forming source/drains (S/Ds), in accordance with an embodiment of the present invention.

FIG. 6A depicts a cross-sectional view of section A-A of the sixth semiconductor structure after fabrication steps removing a portion of the nanosheet stack, forming inner spacers 77, and forming source/drains (S/Ds) 71, in accordance with an embodiment of the present invention. In various embodiments, an anisotropic etch process can remove exposed portions of the nanosheet stack. Once exposed portions of the nanosheet stack are removed, a selective etch, such as a wet chemical etch removes portions of semiconductor layer 4 under a portion of the top semiconductor layer 6 that is beneath spacer 53 on the dummy gate structure. A portion of semiconductor layer 6 remains under the dummy gate structure and a smaller portion of each of semiconductor layer 4 remains under a top layer of semiconductor layer 6 and dummy gate 51 of the dummy gate structure.

In various embodiments, inner spacer 77 is formed. Inner spacer 77 resides under a portion of semiconductor layer 6 and abutting semiconductor layer 4 where semiconductor layer 4 is recessed or removed under semiconductor layer 6 (e.g., semiconductor layer 6 extends further than semiconductor layer 4 under the dummy gate structure). Inner spacer 77 may be conformally deposited with known semiconductor process, such as atomic layer deposition (ALD). An isotropic etch process removes inner spacer 77 from exposed surfaces while leaving a portion of inner spacer 77 in the recesses between layers of semiconductor layer 6 (e.g., the portion of semiconductor layer 6 under spacer 53). In various embodiments, inner spacer 77 is composed of a different dielectric material than spacer 53.

In various embodiments, an epitaxial growth process forms a plurality of S/D 71 in the recesses between the remaining nanosheet stacks and a bottom portion of spacer 53 of the dummy gate structure. S/D 71 can be composed of phosphorous doped Si for nFET and boron doped SiGe for pFET, etc., for example, but are not limited to these materials. S/D 71 can be composed of any suitable source/drain material for use with a semiconductor device connected to a buried power rail.

FIG. 6B depicts a cross-sectional view of section B-B of the sixth semiconductor structure after fabrication steps removing a portion of the nanosheet stack, forming inner spacers 77 (not depicted or discussed with reference to this view), and forming S/D 71, in accordance with an embodiment of the present invention. As depicted in FIG. 6B, the portion of the remaining nanosheet stack inside spacer 53 can be removed. In various embodiments, an epitaxial growth process forms S/D 71 within spacer 53.

Figure 7B:
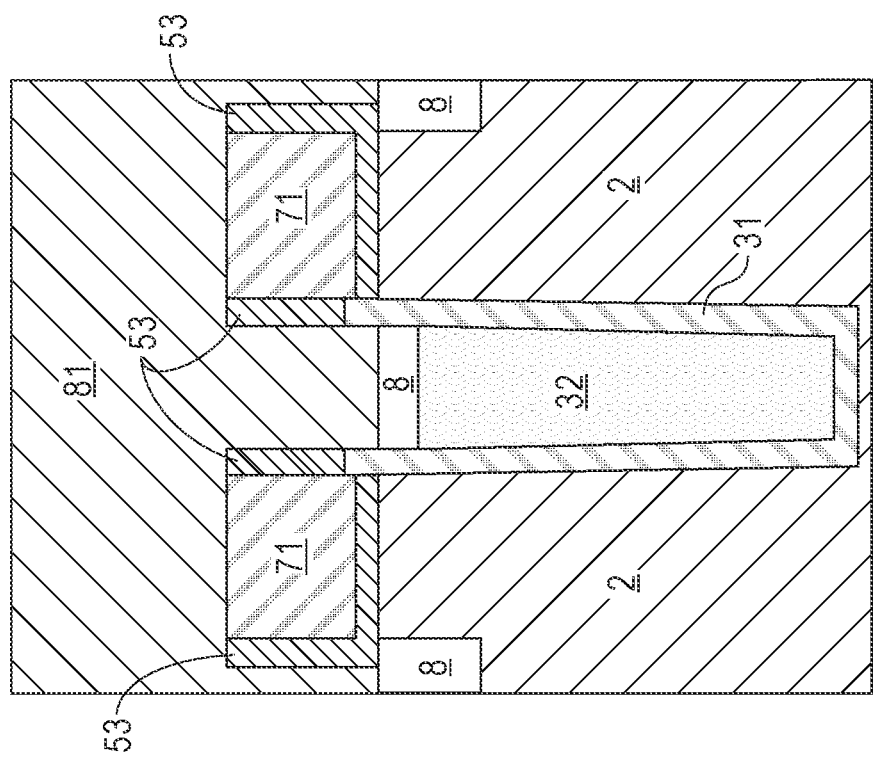
FIG. 7B depicts a cross-sectional view of section B-B of the seventh semiconductor structure after fabrication steps depositing a second OPL and forming a protective spacer around the hardmask, in accordance with an embodiment of the present invention.
Figure 7A:
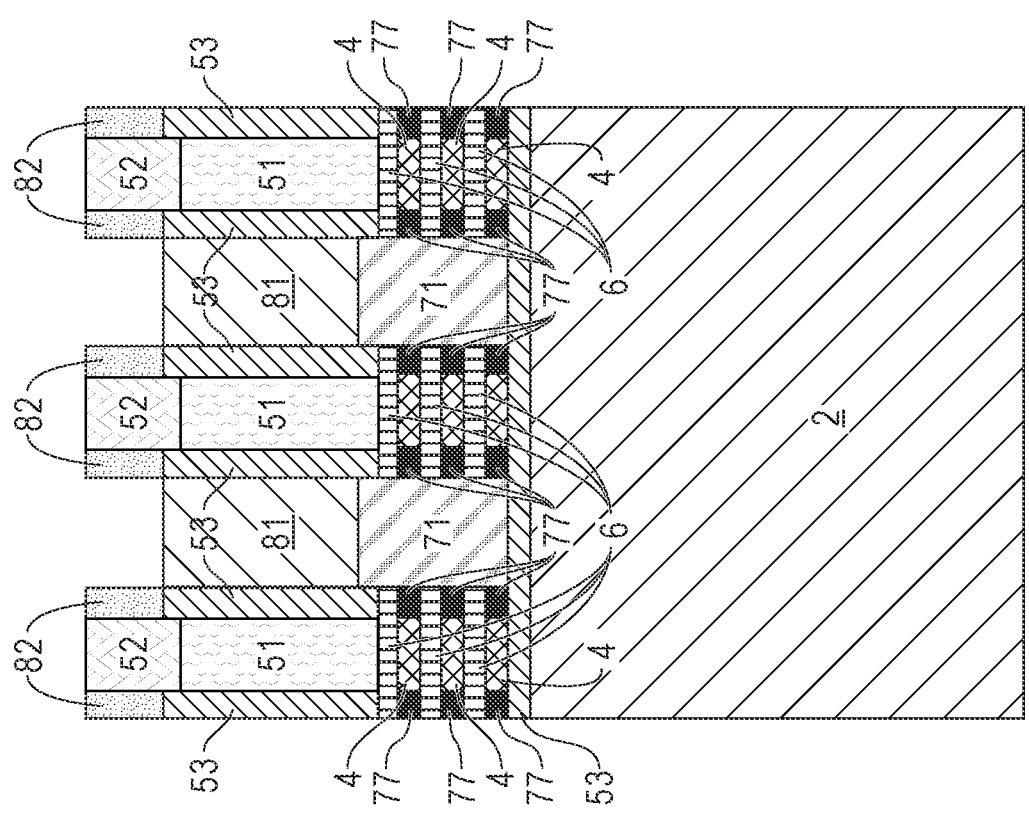
FIG. 7A depicts a cross-sectional view of section A-a of a seventh semiconductor structure after fabrication steps depositing a second OPL and forming a protective spacer around the hardmask, in accordance with an embodiment of the present invention.

FIG. 7A depicts a cross-sectional view of section A-A of the seventh semiconductor structure after fabrication steps depositing OPL 81 and forming protective spacer 82 around hardmask 52, in accordance with an embodiment of the present invention. In various embodiments, a layer of OPL 81 is deposited over the sixth semiconductor structure. An etch removes a top portion of OPL 81 around the dummy gate structure. In various embodiments, after removing the top portion of OPL 81, the top surface of the remaining OPL 81 is above a level of the top surface of dummy gate 51. In some embodiments, the top surface of the remaining OPL 81 is level with the top surface of dummy gate 51. A selective etch of spacer 53 removes a portion of spacer 53 from the sides of hardmask 52.

In various embodiments, a layer of a dielectric material, such as, but not limited to, SiCO, for protective spacer 82 that is deposited over the seventh semiconductor structure prior to an anisotropic etch. In various embodiments, an etch, such as RIE, removes protective spacer 82 from horizontal surfaces of OPL 81, horizontal surfaces of hardmask 52, and top surfaces of protective spacer 82 to form the seventh semiconductor structure. The etch leaves a portion of protective spacer 82 on the vertical walls of hardmask 52 of each of dummy gate 51. In various embodiments, protective spacer 82 is composed of a different dielectric material than spacer 53.

FIG. 7B depicts a cross-sectional view of section B-B of the seventh semiconductor structure after fabrication steps depositing OPL 81 and forming protective spacer 82 around the hardmask (not depicted in this view), in accordance with an embodiment of the present invention. FIG. 7B depicts a layer of OPL 81 is deposited over STI 8, spacer 53, and S/D 71. A top portion of OPL 81 is removed. Protective spacer 82 (not depicted in FIG. 7B) is formed as discussed above.

Figure 8B:
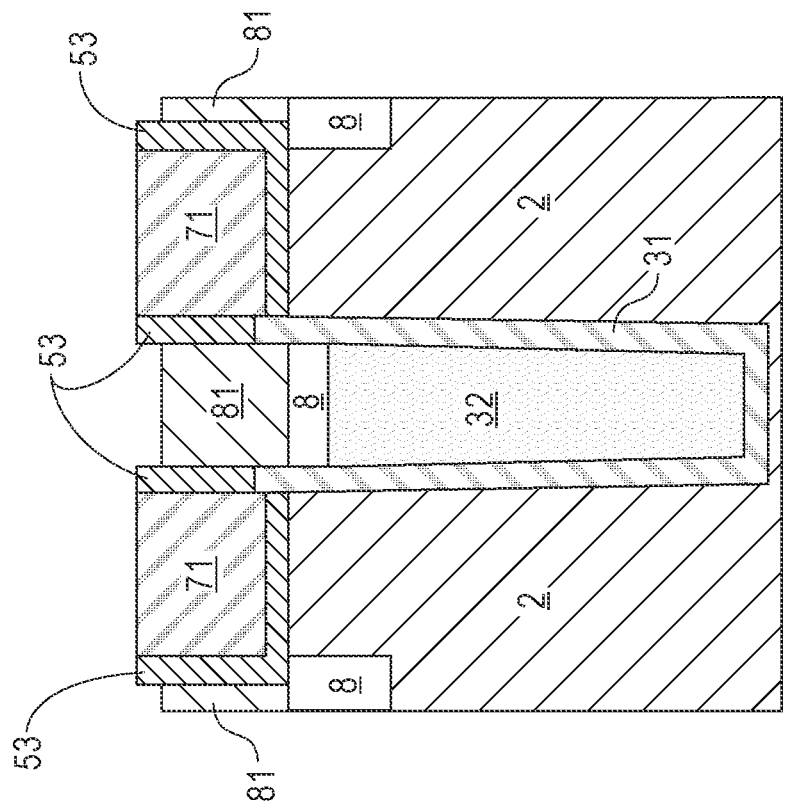
FIG. 8B depicts a cross-sectional view of section B-B of the eighth semiconductor structure after fabrication steps recessing second OPL and forming the first liner on the sides of the dummy gate structures, in accordance with an embodiment of the present invention.
Figure 8A:
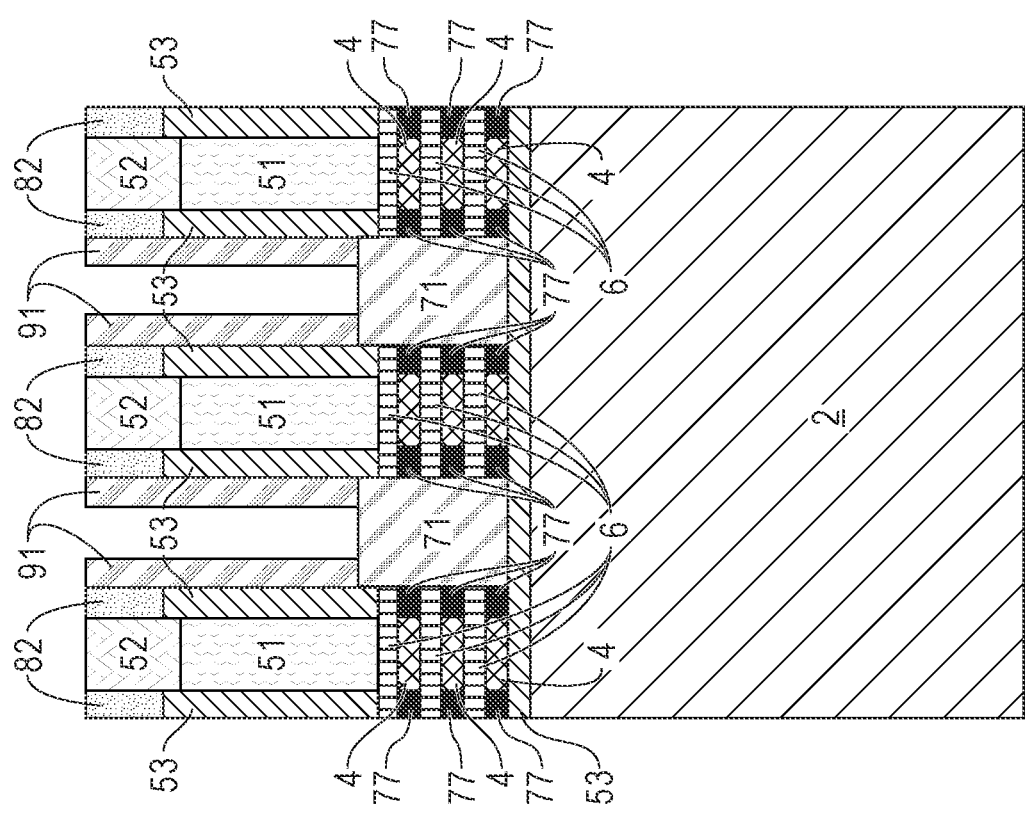
FIG. 8A depicts a cross-sectional view of section A-a of an eighth semiconductor structure after fabrication steps recessing second OPL and forming a first liner on the sides of the dummy gate structures, in accordance with an embodiment of the present invention.

FIG. 8A depicts a cross-sectional view of section A-A of the eighth semiconductor structure after fabrication steps further recessing OPL 81 and forming first liner 91 on the sides of the dummy gate structures, in accordance with an embodiment of the present invention. In various embodiments, OPL 81 is removed above S/D 71. For example, using a selective etch such as RIE, sides of the dummy gate structure and top surfaces of S/D 71 are exposed.

A layer of a sacrificial material for first liner 91 can be deposited with known semiconductor processes, such as ALD or chemical vapor deposition (CVD), over exposed surfaces of the dummy gate structure and S/D 71. First liner 91 may be a sacrificial liner composed of a dielectric material such as TiO, another compound of Ti and O (e.g., $TiO_2$), or other known compatible spacer material. In various embodiments, an anisotropic etch of exposed horizontal surfaces removes first liner 91 from top surfaces of S/D 71 and the top surfaces of the dummy gate structure (e.g., top of hardmask 52 and protective spacer 82). After the etch of first liner 91 on horizontal surfaces, a layer of first liner 91 remains around the vertical sides of the dummy gate structure (i.e., on the sides of spacer 53 and protective spacer 82).

FIG. 8B depicts a cross-sectional view of section B-B of the eighth semiconductor structure after fabrication steps further recessing OPL 81 and forming first liner 91 on the sides of the dummy gate structures (not depicted in this view), in accordance with an embodiment of the present invention. As discussed above with reference to FIG. 8A, OPL 81 is further recessed to a level below the top surfaces of S/D 71 and spacer 53. In FIG. 8B, a portion of OPL 81 remains on each of STI 8 between spacer 53 that surrounds S/D 71.

Figure 9A:
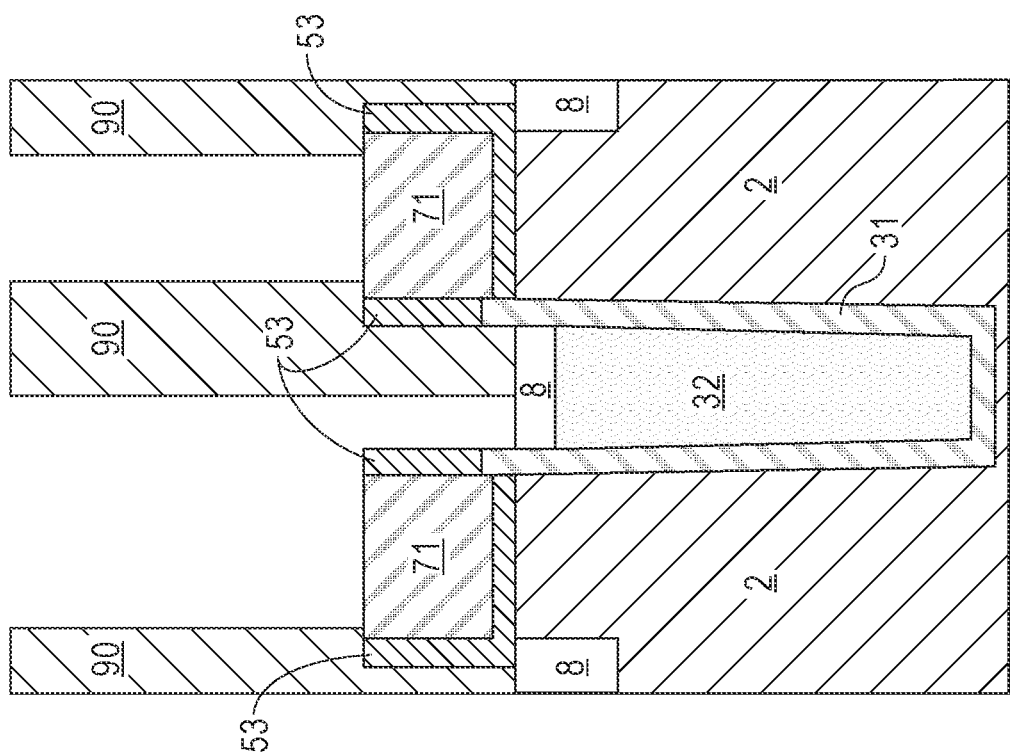
FIG. 9A depicts a cross-sectional view of section A-a of a ninth semiconductor structure after fabrication steps after second OPL ash, third OPL deposition and patterning, in accordance with an embodiment of the present invention.

FIG. 9A depicts a cross-sectional view of section A-A of a ninth semiconductor structure after fabrication steps after ash OPL 81, depositing OPL 90 and patterning OPL 90, in accordance with an embodiment of the present invention. FIG. 9A depicts essentially the same cross-section as FIG. 8A (i.e., OPL 81 and 90 are not depicted in section A-A of FIGS. 8A or 9A).

Figure 9B:
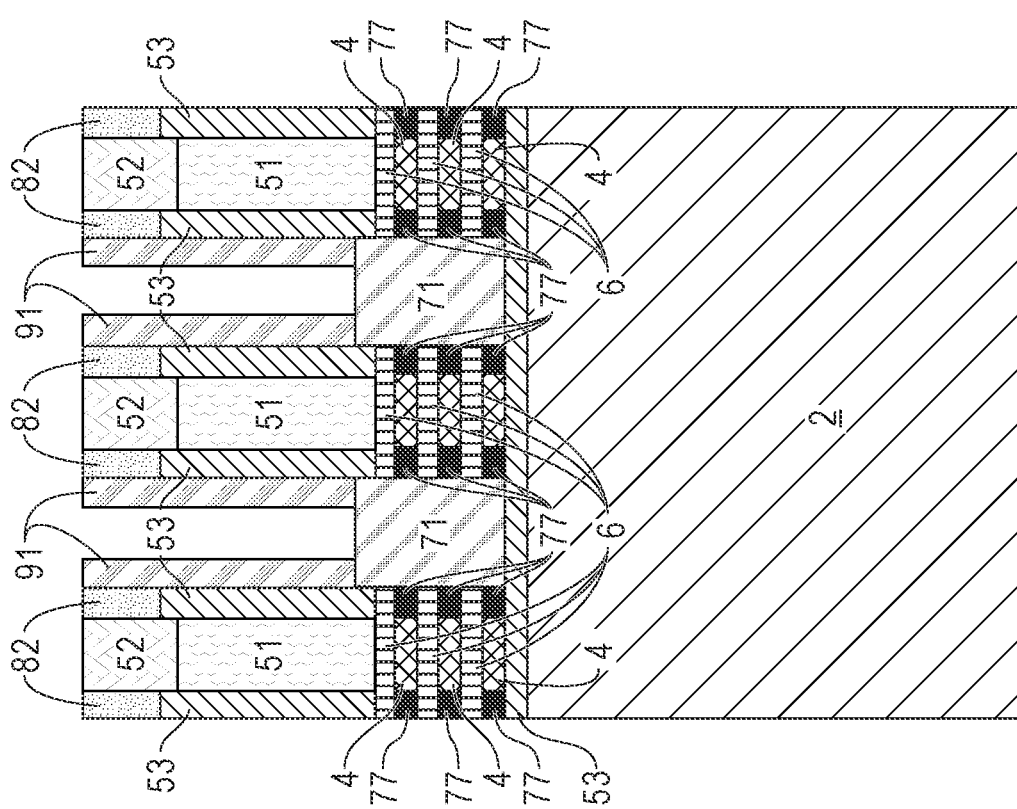
FIG. 9B depicts a cross-sectional view of section B-B of the ninth semiconductor structure after fabrication steps after second OPL ash, third OPL deposition and patterning, in accordance with an embodiment of the present invention.

FIG. 9B depicts a cross-sectional view of section B-B of the ninth semiconductor structure after fabrication steps after ash of the remaining OPL 81, depositing another layer of OPL 90 over the top surface, and patterning OPL 90, in accordance with an embodiment of the present invention. Using known plasma ash processes, the remaining portions of OPL 81 can be removed and a new layer of OPL 90 can be deposited and patterned using known photolithography and etching processes. As depicted in FIG. 9B, in various embodiments, a portion of OPL 90 is removed over the exposed portion of STI 8 above BPR. Additionally, a portion of OPL 90 is removed from a large portion (e.g., most) of S/D 71. During the same etch process, another large portion of OPL 90 is removed over the second S/D 71. After removal of OPL 90, in FIG. 9B, three portions of OPL 90 remain. One portion of OPL 90 is over the leftmost STI 8, spacer 53, and a portion of the left S/D 71, another portion of OPL 90 is over a portion of the middle STI 8, spacer 53, and a portion of the right S/D 71, and a third portion of OPL 90 covers the rightmost STI 8, spacer 53, and a right side of the right S/D 71. In various embodiments, the exposed portion of the middle STI 8 is equal to or less than the unexposed portions of the middle STI 8. In one embodiment, the exposed portion of STI 8 over BPR 32 is greater than the unexposed portion of STI 8 over BPR 32. For example, the exposed or open portion of the middle STI can be approximately 5 to 50 nm in length across width of the middle STI 8 in FIG. 9B but, is not limited to this size.

Figure 10A:
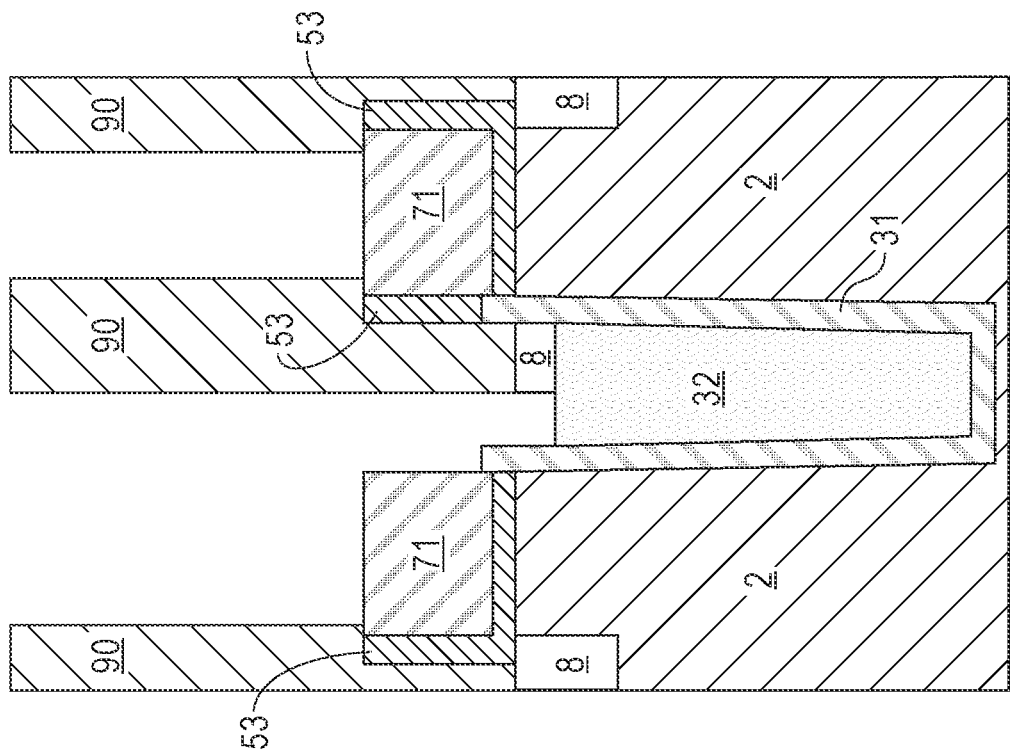
FIG. 10A depicts a cross-sectional view of section A-a of a tenth semiconductor structure after fabrication steps removing exposed first spacer adjacent to an exposed portion of the middle STI 8 and the exposed portion of the middle STI, in accordance with an embodiment of the present invention.

FIG. 10A depicts a cross-sectional view of section A-A of the tenth semiconductor structure after fabrication steps removing exposed spacer 53 along the left S/D 71 (not depicted in this view), in accordance with an embodiment of the present invention. As depicted in FIG. 10A, protective spacer 82 and first liner 91 protect the dummy gate structure from removal during spacer 53 etch. The cross-section depicted in FIG. 10A appears essentially the same as FIG. 9A.

Figure 10B:
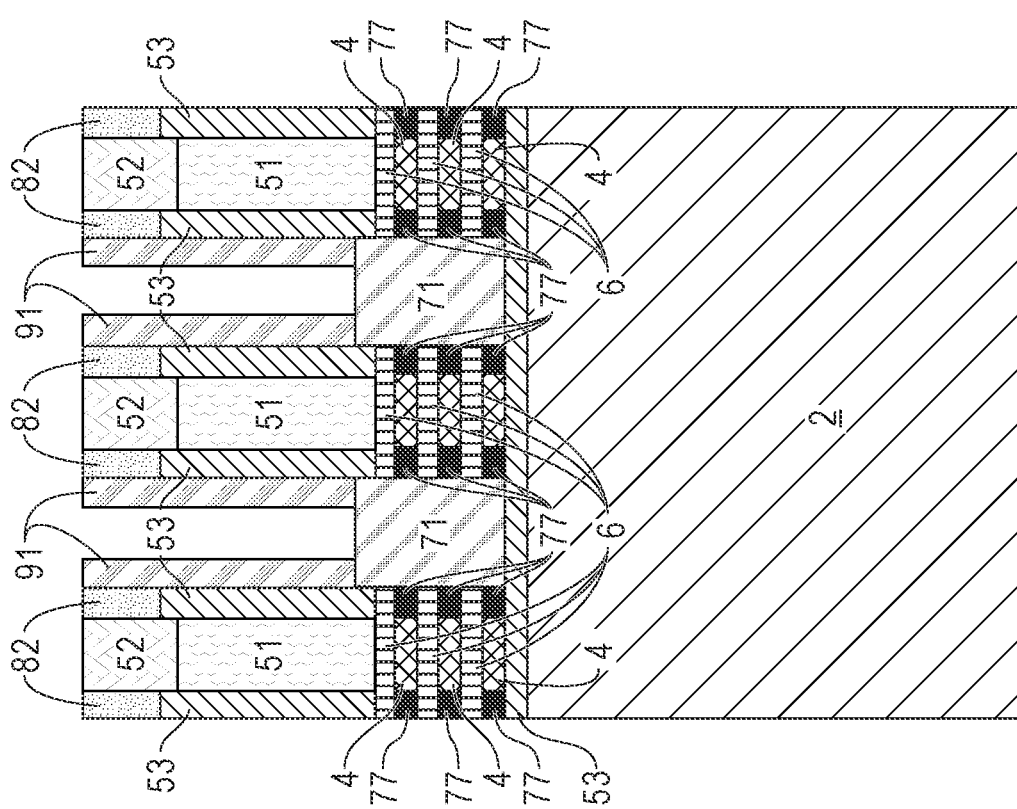
FIG. 10B depicts a cross-sectional view of section B-B of the tenth semiconductor structure after fabrication steps removing exposed first spacer adjacent to an exposed portion of the middle STI and the exposed portion of the middle STI, in accordance with an embodiment of the present invention.

FIG. 10B depicts a cross-sectional view of section B-B of the tenth semiconductor structure after fabrication steps removing exposed spacer 53 along the left S/D 71 and removing the portion of STI 8 above BPR 32, in accordance with an embodiment of the present invention. Using known semiconductor etch processes, for example, RIE of spacer 53, the exposed portion of spacer 53 of the leftmost S/D 71 (i.e., the portion of spacer 53 above BPR liner 31) is removed. In various embodiments, the removal of spacer 53 above BPR liner 31 exposes a portion of the side of the leftmost S/D 71 and the top surface of BPR liner 31 that is adjacent to the exposed portion of BPR 32. In this step, a portion of a side of S/D 71 adjacent to the exposed portion of BPR 32 is also exposed (i.e., after removing one of spacer 53 abutting S/D 71). The pulldown or removal of one of spacer 53 abutting S/D 71 and adjacent to the exposed portion of BPR 32 will allow formation of the wraparound buried contact connecting S/D 71 to BPR 32 as depicted in FIGS. 18A, 18B, 19A and 19B upon completion of the wraparound buried contact (i.e., contact 12).

Figure 11B:
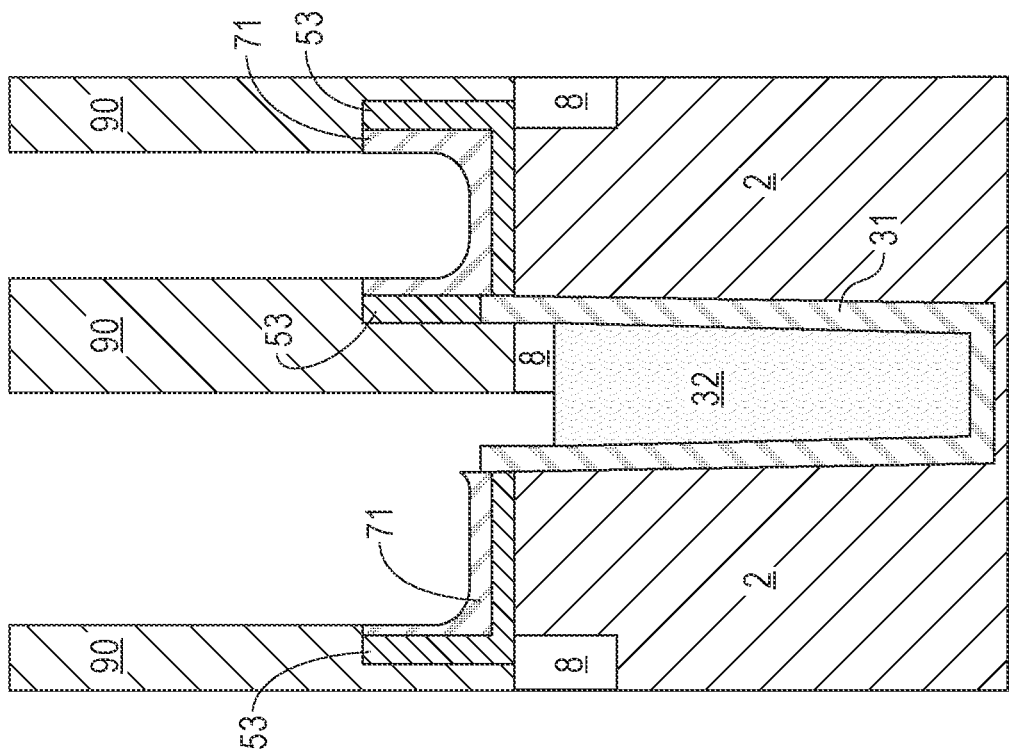
FIG. 11B depicts a cross-sectional view of section B-B of the eleventh semiconductor structure after fabrication steps recessing the S/Ds, in accordance with an embodiment of the present invention.
Figure 11A:
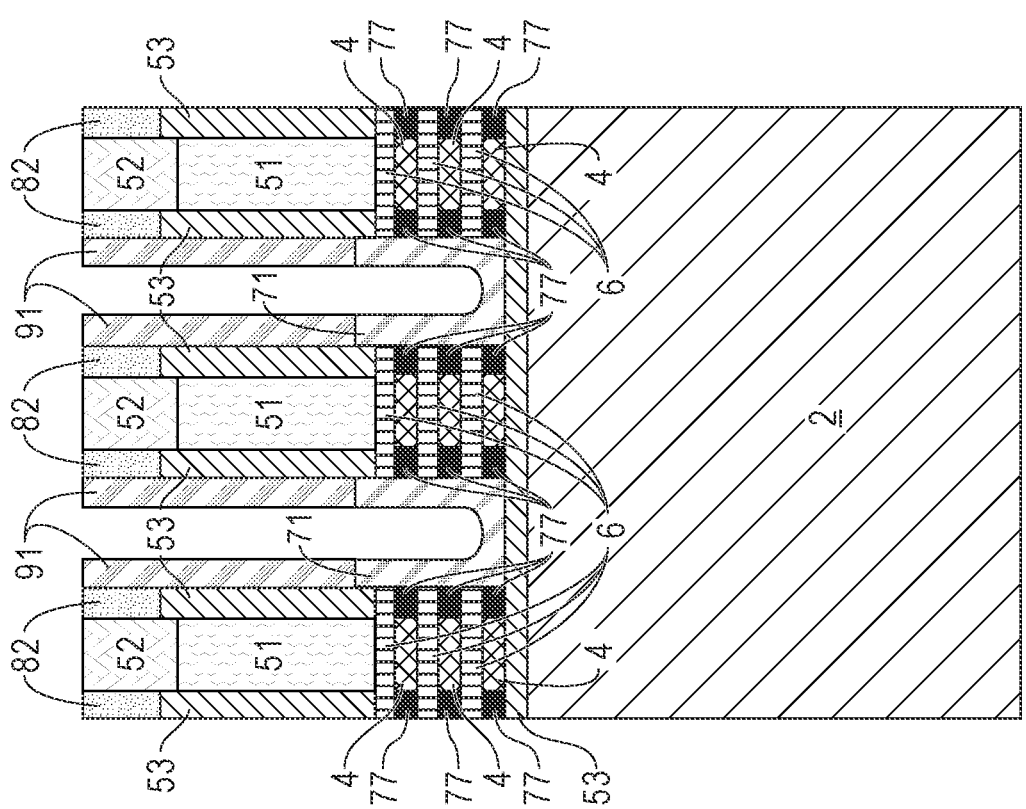
FIG. 11A depicts a cross-sectional view of section A-a of an eleventh semiconductor structure after fabrication steps recessing the S/Ds, in accordance with an embodiment of the present invention.

FIG. 11A depicts a cross-sectional view of section A-A of the eleventh semiconductor structure after fabrication steps recessing S/D 71, in accordance with an embodiment of the present invention. In various embodiments, an etch process removes a portion of each of S/D 71. For example, a plasma etch or other dry etch partially removes the exposed portion of S/D 71. The etch of S/D 71 leaves a U-shaped portion of S/D 71 on the sides of the nanosheet stack and inner spacer 77, on the sides of a lower portion of side spacer 53 along dummy gate 51, and over bottom spacer 53. In some embodiments, a thickness of the remaining U-shaped portion of STI 71 is in the range of 5 to 20 nm but, is not limited to this thickness. The thickness of S/D 71 may vary depending on location on S/D 71 and etch parameters (e.g., may thicker in the corners, the bottom, or sides).

FIG. 11B depicts a cross-sectional view of section B-B of the eleventh semiconductor structure after fabrication steps recessing S/Ds 71, in accordance with an embodiment of the present invention. After S/D 71 etch using the processes described above, in FIG. 11B, an L-shaped portion of S/D 71 remains in the leftmost S/D 71 (adjacent to the exposed portion of BPR 32) and a U-shaped portion of S/D 71 remains of the rightmost S/D 71. A long leg of the L-shaped remaining portion of the leftmost S/D 71 is parallel to the top surface of semiconductor substrate 2. In various embodiments, after the etch process, a cavity (e.g., either L-shaped or U-shaped) is formed in each of S/D 71. As depicted in FIG. 11B, OPL 90 remains above exposed portions of STI 8, above top surfaces of spacer 53, the top of the vertical leg or the shorter vertical leg of the L-shaped leftmost S/D 71, and the top surfaces of the legs of the U shaped remaining portions of the rightmost S/D 71 (e.g., OPL 90 is not in the lower parts of the U or L). The range of thickness of the remaining S/D 71 for each of S/D 71 is similar to that discussed with reference to FIG. 11A.

Figure 12B:
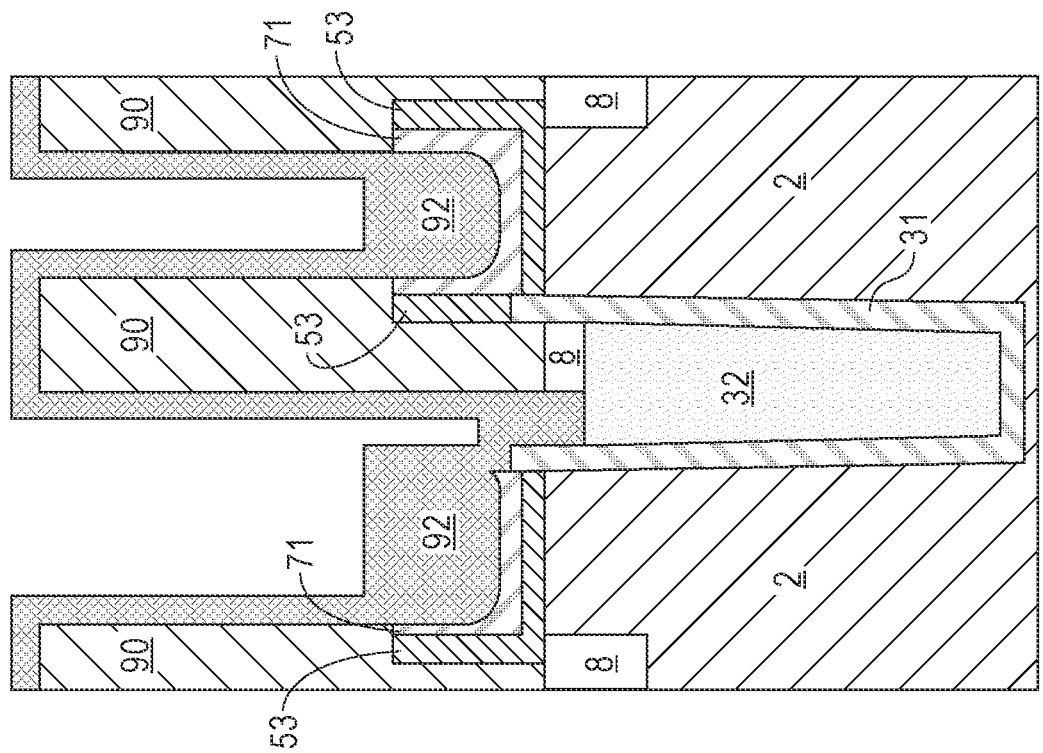
FIG. 12B depicts a cross-sectional view of section B-B of the twelfth semiconductor structure after fabrication steps removing the first liner to deposit a second liner, in accordance with an embodiment of the present invention.
Figure 12A:
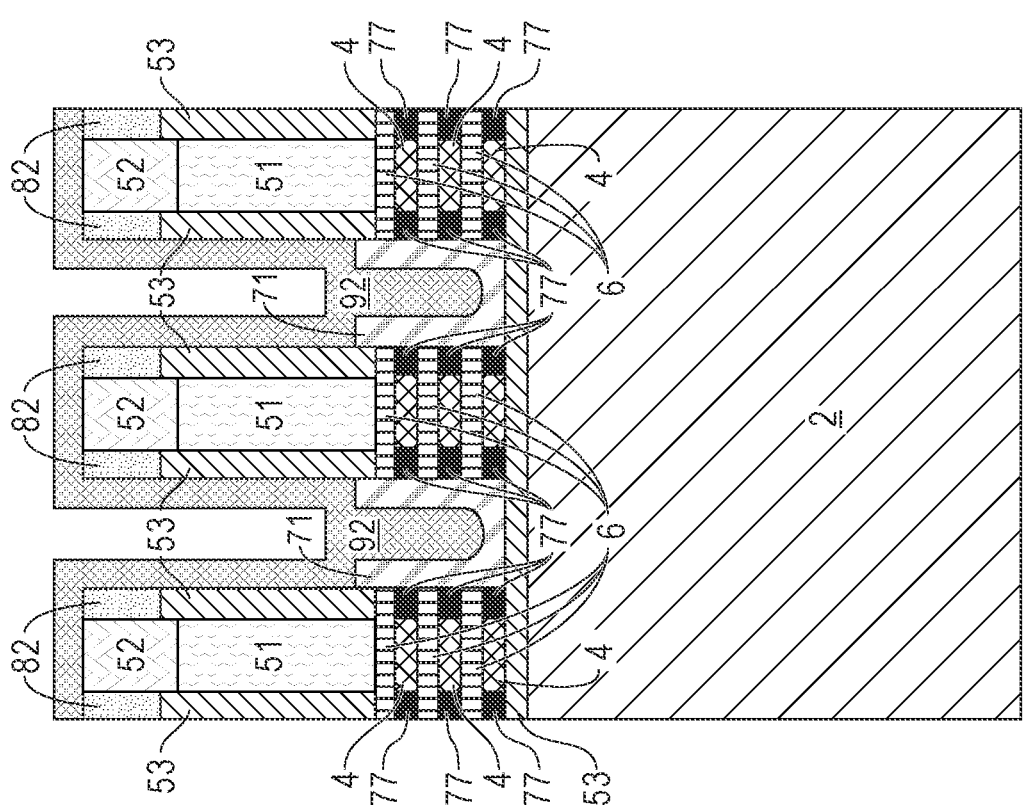
FIG. 12A depicts a cross-sectional view of section A-A of a twelfth semiconductor structure after fabrication steps removing the first liner to deposit a second liner, in accordance with an embodiment of the present invention.

FIG. 12A depicts a cross-sectional view of section A-A of a twelfth semiconductor structure after fabrication steps removing liner 91 to deposit liner 92, in accordance with an embodiment of the present invention. Using known semiconductor etch processes, liner 91 is removed from spacer 53 and spacer 82 on the sides of the dummy gate structures. In various embodiments, a layer of liner 92 is conformally deposited over the twelfth semiconductor structure. Liner 92 can be deposited on the dummy gate structures and over S/D 71. In various embodiments, liner 92 fills the U-shaped cavity in S/D 71. For example, liner 92 conformally deposits in the U-shaped cavity of S/D 71 until it is pinched off or the cavity is essentially filled. In various embodiments, liner 92 is a dielectric material. For example, liner 92 may be TiO, a combination of Ti with two or more oxygen atoms, or other dielectric material. In various embodiments, liner 92 is the same material as liner 91. In one embodiment, liner 91 and 92 are composed of different materials.

FIG. 12B depicts a cross-sectional view of section B-B of the twelfth semiconductor structure after fabrication steps removing liner 91 to deposit liner 92, in accordance with an embodiment of the present invention. As discussed above with reference to FIG. 12A, liner 91 is removed using known etch processes and liner 92 can be conformally deposited over the twelfth semiconductor structure. As depicted in FIG. 12B, liner 92 deposits over exposed portions of OPL 90, S/D 71, BPR liner 31, BPR 32, and a side of middle STI 8. Liner 92 can fill or partially the U-shaped cavity over the rightmost S/D 71 and the L-shaped cavity in the leftmost S/D 71. As discussed above, the conformal deposition of liner 92 may be pinched off or fill cavities formed by S/D 71. In the case of the leftmost S/D 71, liner 92 may partially fill the space between the vertical leg of S/D 71 and OPL 90 above BPR 32 and STI 8 as depicted in FIG. 12B. In other cases, (not depicted) liner 92 may fill the space between leftmost S/D 71 and OPL 90 over BPR 32.

Figure 13A:
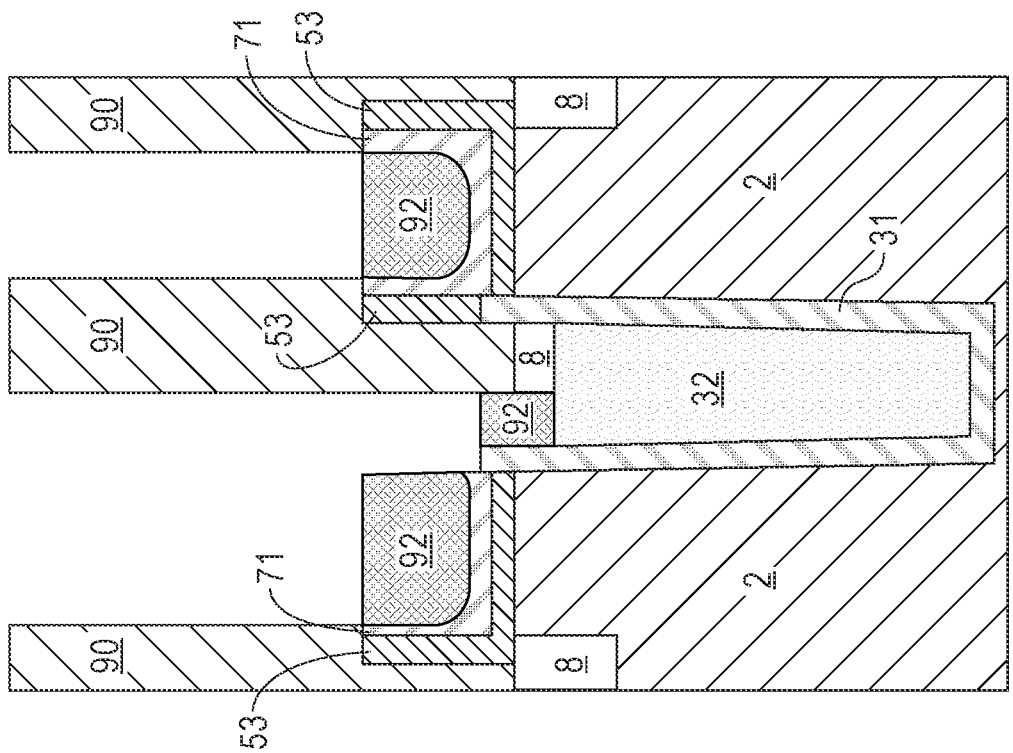
FIG. 13A depicts a cross-sectional view of section A-A of a thirteenth semiconductor structure after fabrication steps isotopically etching the second liner, in accordance with an embodiment of the present invention.

FIG. 13A depicts a cross-sectional view of section A-A of a thirteenth semiconductor structure after fabrication steps isotopically etching portions of liner 92, in accordance with an embodiment of the present invention. Using known isotropic etch processes, liner 92 can be removed from exposed surfaces of the dummy gate structure and the top surface of S/D 71 but, the etch process leaves a portion of liner 92 within the U-shaped cavities in S/D 71.

Figure 13B:
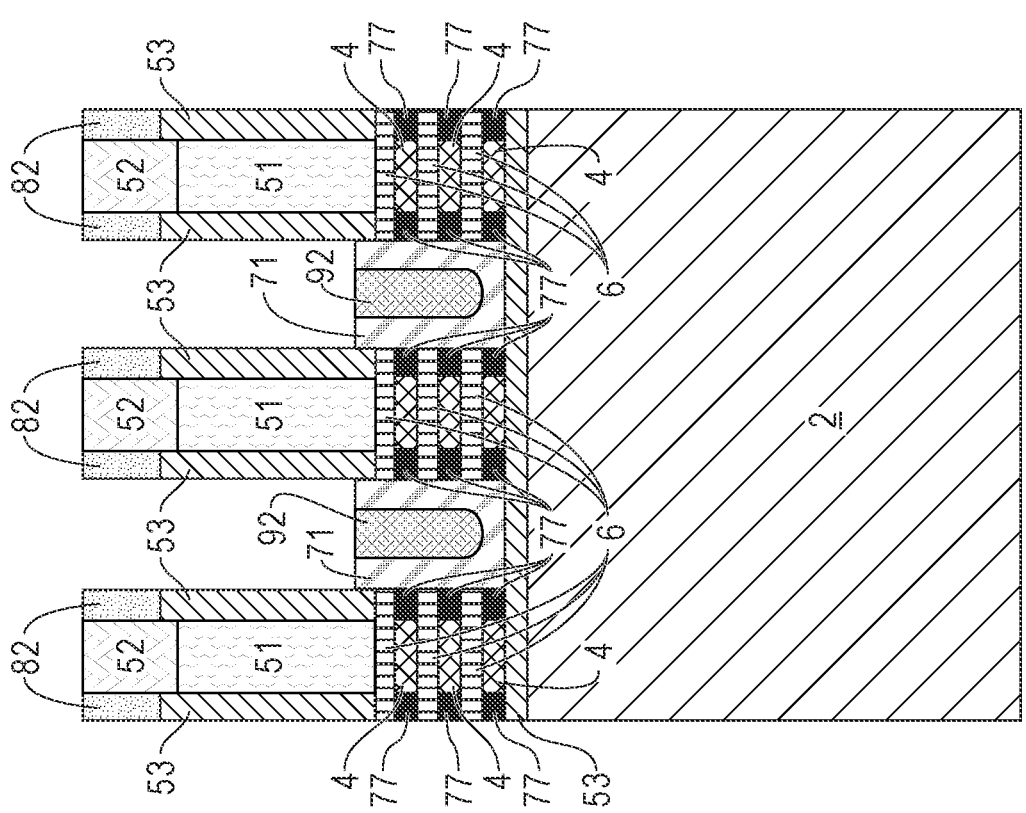
FIG. 13B depicts a cross-sectional view of section B-B of the thirteenth semiconductor structure after fabrication steps isotopically etching the second liner, in accordance with an embodiment of the present invention.

FIG. 13B depicts a cross-sectional view of section B-B of the thirteenth semiconductor structure after fabrication steps isotopically etching portions of liner 92, in accordance with an embodiment of the present invention. As discussed above, using known isotropic etch processes, liner 92 can be removed from exposed surfaces of OPL 90, from a top surface of BPR liner 31 adjacent to the removed portion of the middle STI 8 and from the left S/D 71. In various embodiments, the etch process leaves a portion of liner 92 in the L-shaped cavity in the left S/D 71 and in the U-shaped cavity of the right S/D 71. In this case, liner 92 can cover or protect the top surface of the U-shaped or L shaped cavities of the remaining S/D 71.

Figure 14B:
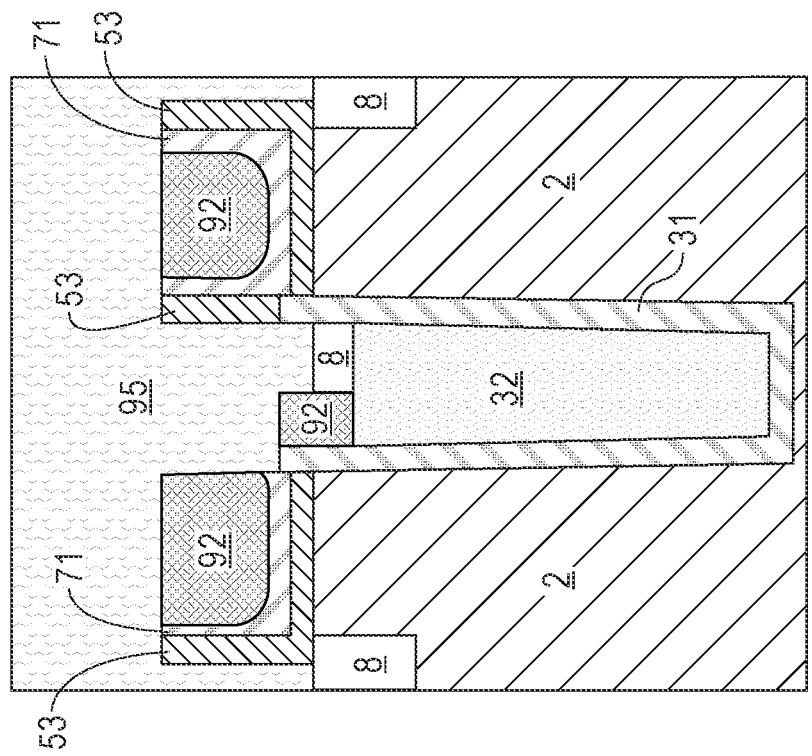
FIG. 14B depicts a cross-sectional view of section B-B of the fourteenth semiconductor structure after fabrication steps removing dummy gate structure and replacing with a metal gate structure, in accordance with an embodiment of the present invention.
Figure 14A:
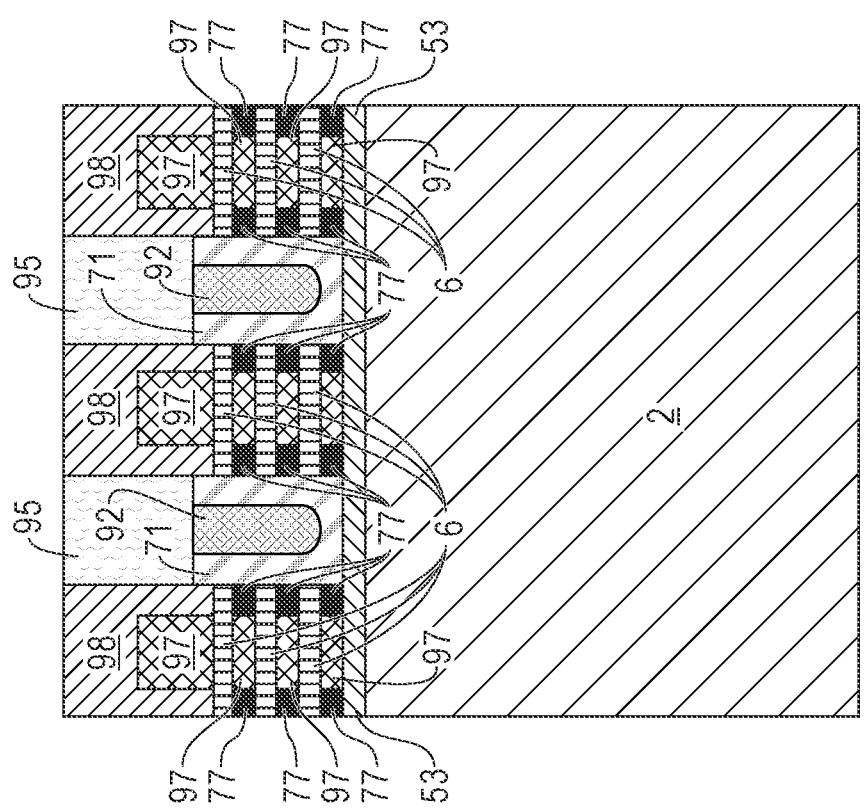
FIG. 14A depicts a cross-sectional view of section A-A of a fourteenth semiconductor structure after fabrication steps forming an ILD layer, performing CMP, removing dummy gate structure, and replacing with a metal gate structure, in accordance with an embodiment of the present invention.

FIG. 14A depicts a cross-sectional view of section A-A of a fourteenth semiconductor structure after fabrication steps forming ILD 95, CMP down to dummy gate, removing dummy gate structure and replacing with a metal gate structure, in accordance with an embodiment of the present invention. A plasma ash of OPL 90 (not depicted in this view) removes OPL 90. A layer of ILD 95 is deposited over the thirteenth semiconductor structure followed by a CMP removing a top portion of ILD 95 and hardmask 52 from the tops of the dummy gate structure. Using known semiconductor processes to remove the dummy gate structures, each of semiconductor layer 4 are removed so that a dummy gate replacement can occur. In various embodiments, metal gate structure 97 with a metal gate (not depicted), high-k gate dielectric material (not depicted) and a gate dielectric cap such as cap 98 replaces the dummy gate structure and fills the gaps created by removal of semiconductor layer 4 in the nanosheet stack. The remaining portions of each of semiconductor layer 6 bisect portions of metal gate structure 97 as depicted in FIG. 14A.

Cap 98 formed over the gate in gate structure 97 can facilitate self-aligned contact formation. Cap 98, which may also be used as a gate spacer, can be a dielectric material such as a nitride, oxide, a combination of Ni and 0, or another similar dielectric material. A CMP may be performed after cap 98 deposition. Using known semiconductor processes, metal gate structure (i.e., high-k gate dielectric material, metal gate, and cap 98) in former dummy gate structure and semiconductor layer 4 locations. Because ILD 95 pulldown in this step occurs before replacement metal gate structure formation, after metal gate structure formation, ILD 95 can be removed can be removed in FIG. 15A without damaging cap 98.

FIG. 14B depicts a cross-sectional view of section B-B of the fourteenth semiconductor structure after fabrication steps removing dummy gate structure and replacing with a metal gate structure, in accordance with an embodiment of the present invention. In various embodiments, the metal gate structures extend in a perpendicular direction to BPR 32. As discussed above, a plasma ash of OPL 90 removes OPL 90. A layer of ILD 95 is deposited over the thirteenth semiconductor structure followed by a CMP removing a top portion of ILD 95. As depicted in FIG. 14B, a portion of ILD 95 remains over a portion of each of left and right most STI 8, over the remaining portion of the middle STI 8, over exposed surfaces of spacer 53, BPR liner 31, S/D 71, and liner 92.

Figure 15A:
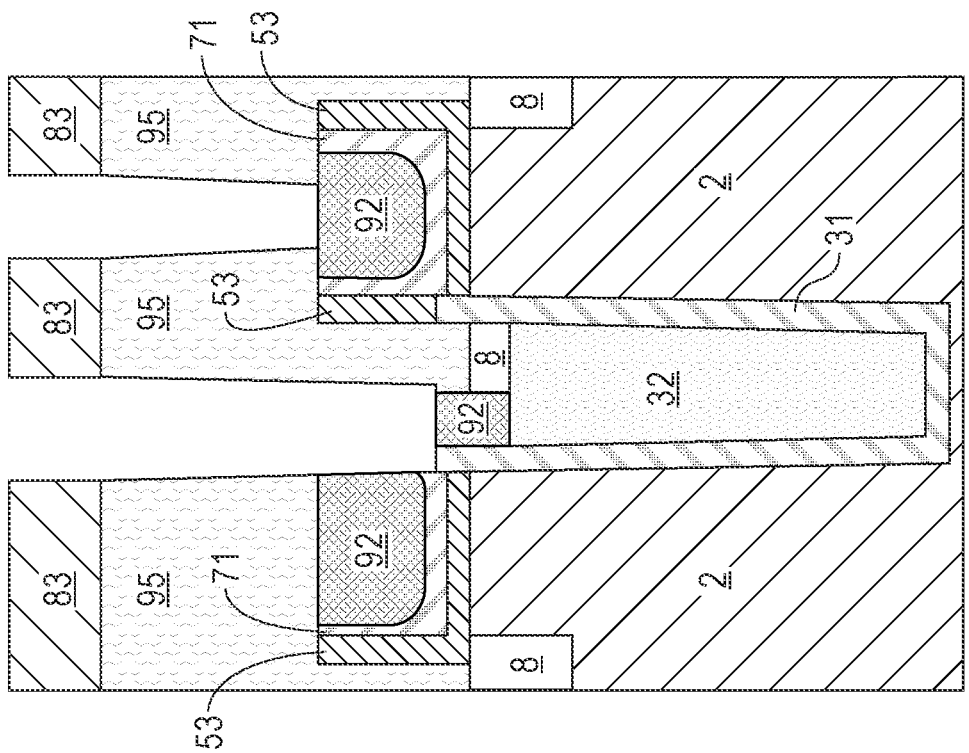
FIG. 15A depicts a cross-sectional view of section A-A of a fifteenth semiconductor structure after fabrication steps depositing layer of interlayer dielectric (ILD) covered with a third OPL and patterning for contacts, in accordance with an embodiment of the present invention.

FIG. 15A depicts a cross-sectional view of section A-A of a fifteenth semiconductor structure after fabrication steps depositing another layer of ILD 95 covered with OPL 83 and patterning for contact formation, in accordance with an embodiment of the present invention. Another layer of ILD 95 is deposited over the fifteenth semiconductor structure and then, ILD 95 is covered by a layer of OPL 83. Using known photolithography processes and etch, a portion of OPL 83 and a portion of ILD 95 over a leftmost S/D 71 and liner 92 can be selectively removed. The selective removal of portions of OPL 83 and ILD 95 exposes a top surface of the leftmost S/D 71 and liner 92. By performing an early spacer pull down (e.g., etch and deposit of ILD 95 above S/D 71), the S/D 71 area can be contacted after OPL 83 and ILD 95 are selectively removed, for example, by RIE, without damaging cap 98 of metal gate structure 97.

Figure 15B:
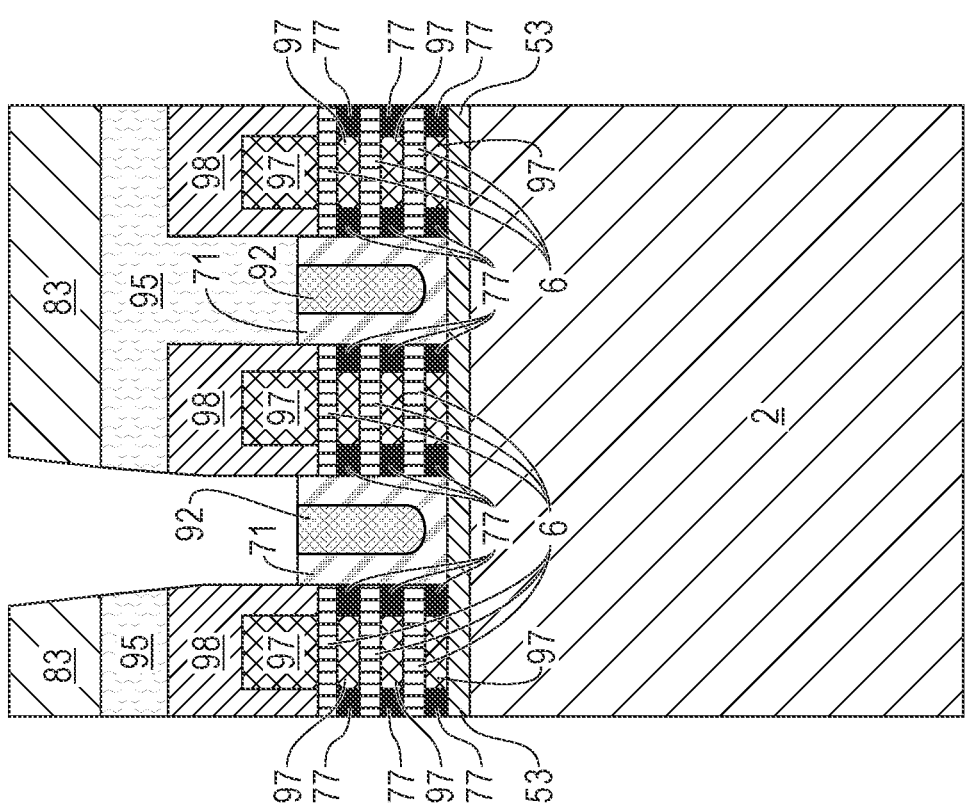
FIG. 15B depicts a cross-sectional view of section B-B of the fifteenth semiconductor structure after fabrication steps depositing a layer of ILD covered with a third OPL and patterning for contacts, in accordance with an embodiment of the present invention.

FIG. 15B depicts a cross-sectional view of section B-B of the fifteenth semiconductor structure after fabrication steps depositing ILD covered with a third OPL and patterning for contacts, in accordance with an embodiment of the present invention. As discussed above, another layer of ILD 95 is deposited over the fifteenth semiconductor structure and then, ILD 95 is covered by a layer of OPL 83. Using known photolithography processes and etch, portions of OPL 83 and ILD 95 over a leftmost S/D 71, over a top surface BPR liner 31 adjacent to leftmost S/D 71, and over liner 92 that is over BPR 32 can be selectively removed along with a portion of OPL 83 and ILD 95 over a center of liner 92 in the rightmost S/D 71. The selective removal of portions of OPL 83 and ILD 95 exposes a top surface of BPR liner 31 and liner 92 adjacent to the leftmost S/D 71 and a center portion of liner 92 in the rightmost S/D 71.

Figure 16B:
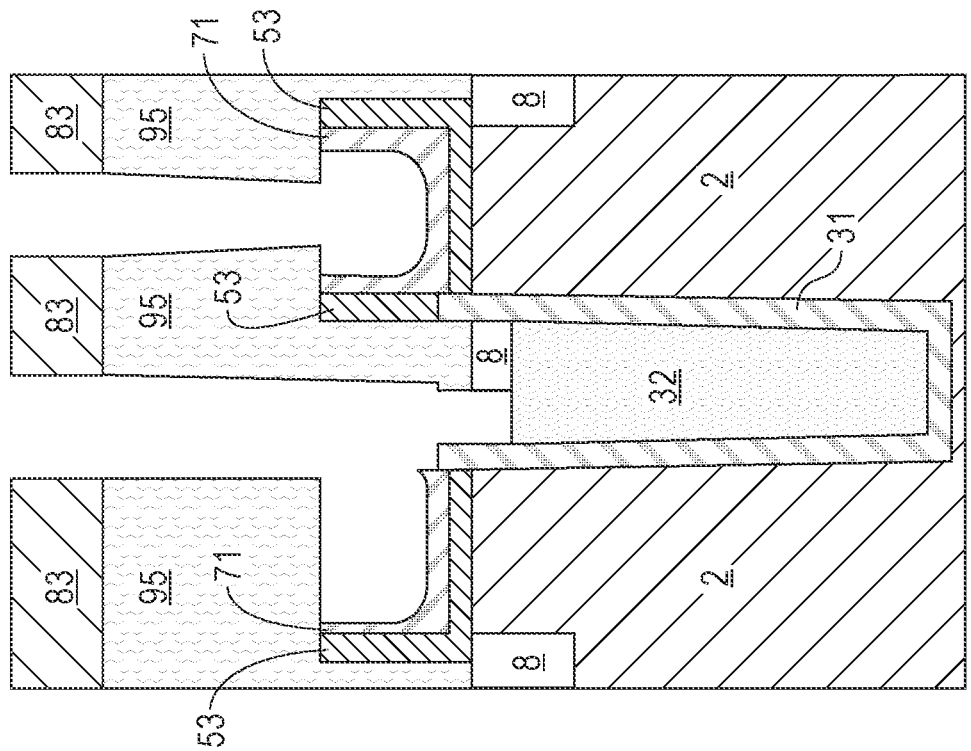
FIG. 16B depicts a cross-sectional view of section B-B of the sixteenth semiconductor structure after fabrication steps removing the second liner, in accordance with an embodiment of the present invention.
Figure 16A:
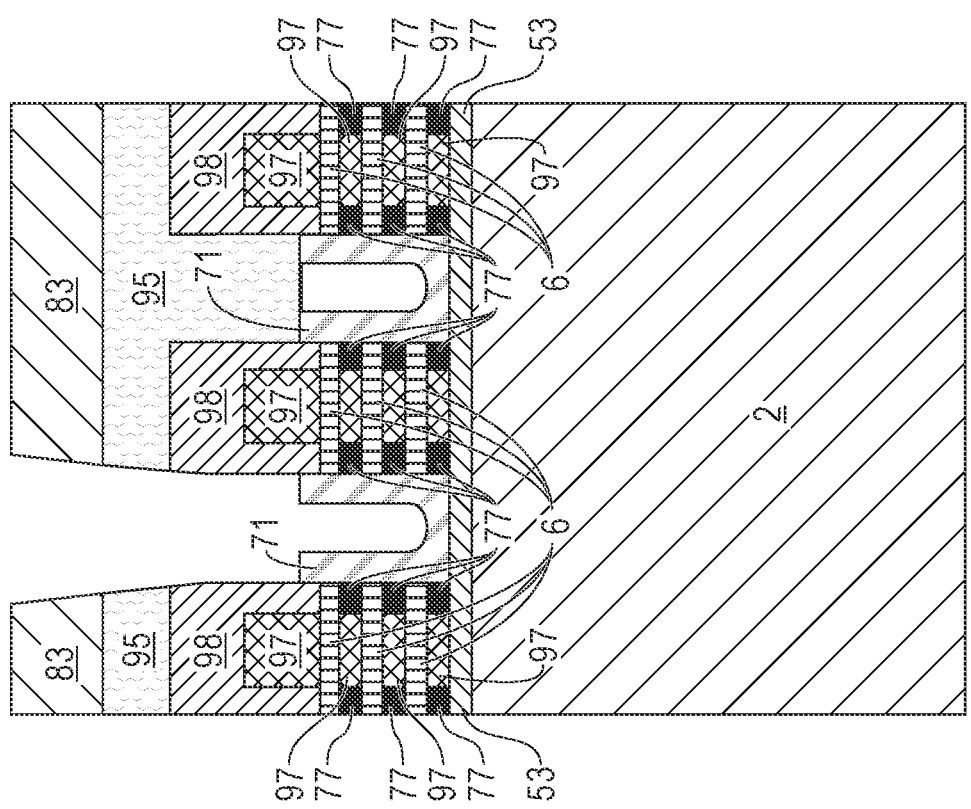
FIG. 16A depicts a cross-sectional view of section A-A of a sixteenth semiconductor structure after fabrication steps removing the second liner, in accordance with an embodiment of the present invention.

FIG. 16A depicts a cross-sectional view of section A-A of a sixteenth semiconductor structure after fabrication steps removing liner 92, in accordance with an embodiment of the present invention. Liner 92 can be removed from the cavities in S/D 71 using known semiconductor etch processes.

FIG. 16B depicts a cross-sectional view of section B-B of the sixteenth semiconductor structure after fabrication steps removing liner 92, in accordance with an embodiment of the present invention. As depicted in FIG. 16B, liner 92 is removed from the cavities in S/D 71 and from the area where a portion of the middle STI 8 was removed over BPR 32. This step exposes top surfaces of the cavities in S/D 71 and a portion of BPR 32 for contact formation.

Figure 17A:
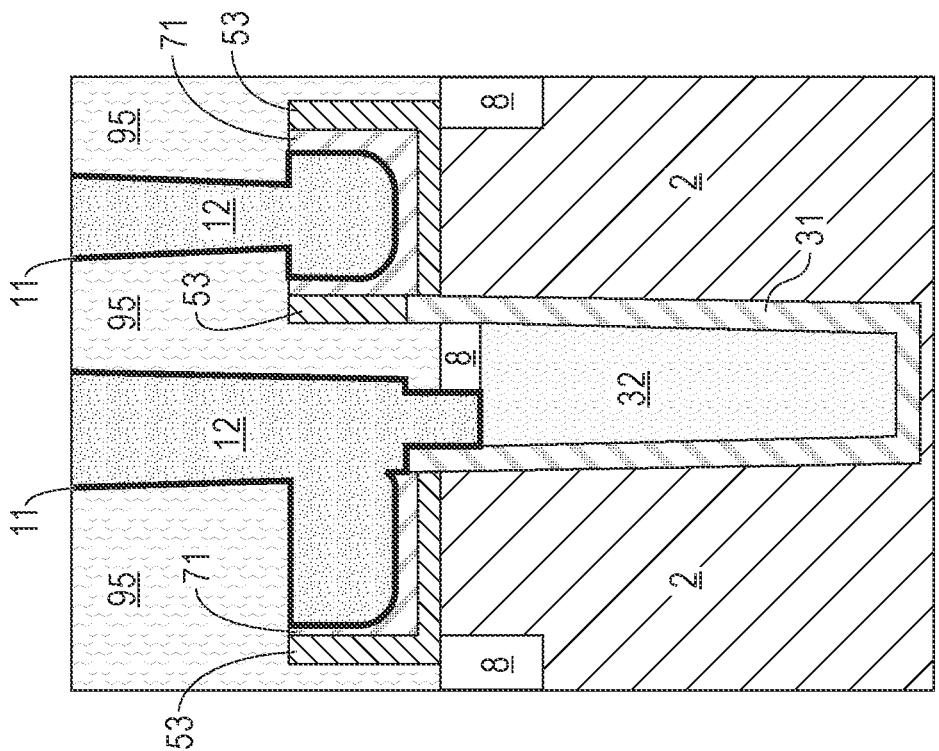
FIG. 17A depicts a cross-sectional view of section A-A of a seventeenth semiconductor structure after fabrication steps depositing a contact liner and contact metal, in accordance with an embodiment of the present invention.

FIG. 17A depicts a cross-sectional view of section A-A of a seventeenth semiconductor structure after fabrication steps depositing a contact liner and contact metal, in accordance with an embodiment of the present invention. As depicted in FIG. 17A, contact liner 11 and contact 12 are deposited in the cavities or trenches left by the removal of OPL 83 and ILD 95 in the previous step. Contact liner 11 can be composed of a metal, such as, Ti, Ni, NiPt, or other similar metal. Contact liner 11 can form a silicide with S/D 71. Contact 12 can be copper, ruthenium, W, or the like but, is not limited to these metals.

Figure 17B:
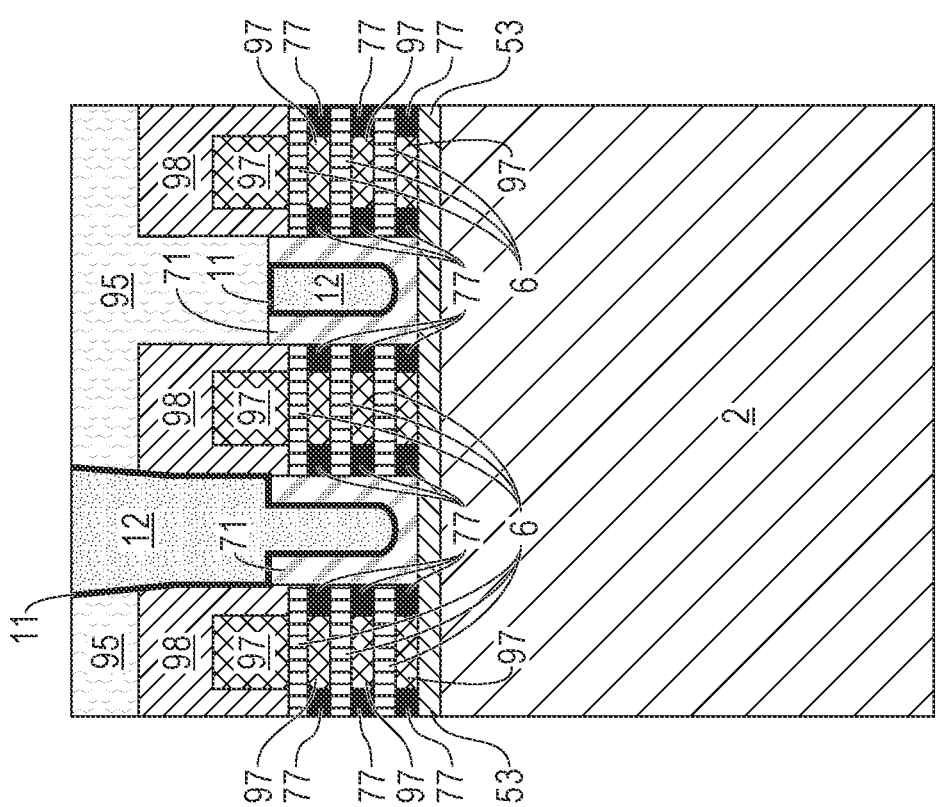
FIG. 17B depicts a cross-sectional view of section B-B of the ninth semiconductor structure after fabrication steps depositing a contact liner and contact metal, in accordance with an embodiment of the present invention.

FIG. 17B depicts a cross-sectional view of section B-B of the ninth semiconductor structure after fabrication steps depositing contact liner 11 and contact 12, in accordance with an embodiment of the present invention. In various embodiments, contact liner 11 and contact 12 are deposited in the cavities or trenches left by the removal of OPL 83 and ILD 95 in the previous step. As depicted in FIG. 17B, contact liner 11 and contact 12 on the left connect BPR 32 to the leftmost S/D 71 and while contact liner 11 and contact 12 on the right provides a connection for the rightmost S/D 71 to metal layers above (not depicted in FIG. 17B). Contact liner 11 and contact 12 on the left connecting the exposed top surface of BPR 32 to S/D 71 provides a wraparound contact to BPR 32 (i.e., connects S/D 71 of a semiconductor device to BPR 32).

FIG. 18 depicts a cross-sectional view of section B-B of the eighteenth semiconductor structure after fabrication steps depositing a layer of OPL 85, patterning OPL 85, and removing a portion of contact liner 11 and contact 12, in accordance with an embodiment of the present invention. The view of section A-A of the eighteenth semiconductor structure remains essentially the same as FIG. 17A and therefore, is not depicted. In FIG. 18, a layer of OPL 85 is deposited and patterned with conventional semiconductor processes for selectively removing OPL. A selective metal etch of contact liner 11 and contact 12 is performed. In various embodiments, a portion of contact 12 over a portion of BPR 32 is removed to reduce unnecessary metal in the contact. For example, when a width of the leftmost metal contact 12 can be in the range of 10 to 200 nm wide and a depth or metal contact height from BPR 32 to a top of contact liner 11 can be in the range of 30 to 100 nm but, metal contact 12 is not limited to these sizes. A portion of contact 12 approximately 40 to 100 nm may be removed. The removal of unnecessary contact improves electrical performance and can reduce capacitance of metal contact 12.

Figure 19B:
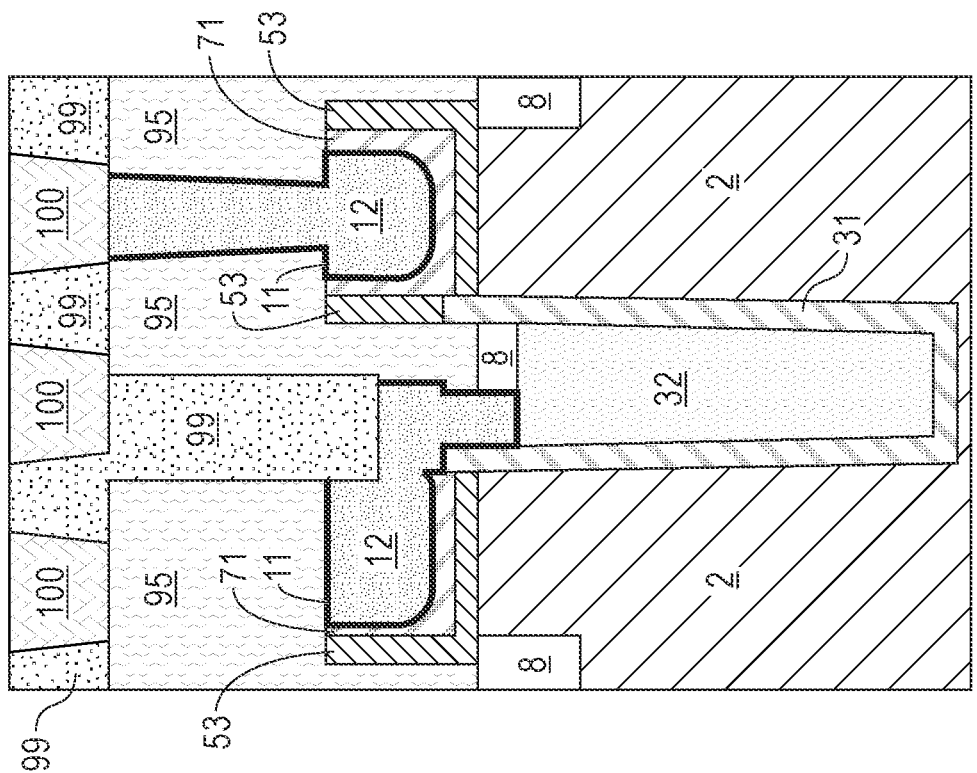
FIG. 19B depicts a cross-sectional view of section B-B of the nineteenth semiconductor structure after fabrication steps forming M0 metal layer surrounded by M0 ILD, in accordance with an embodiment of the present invention.
Figure 19A:
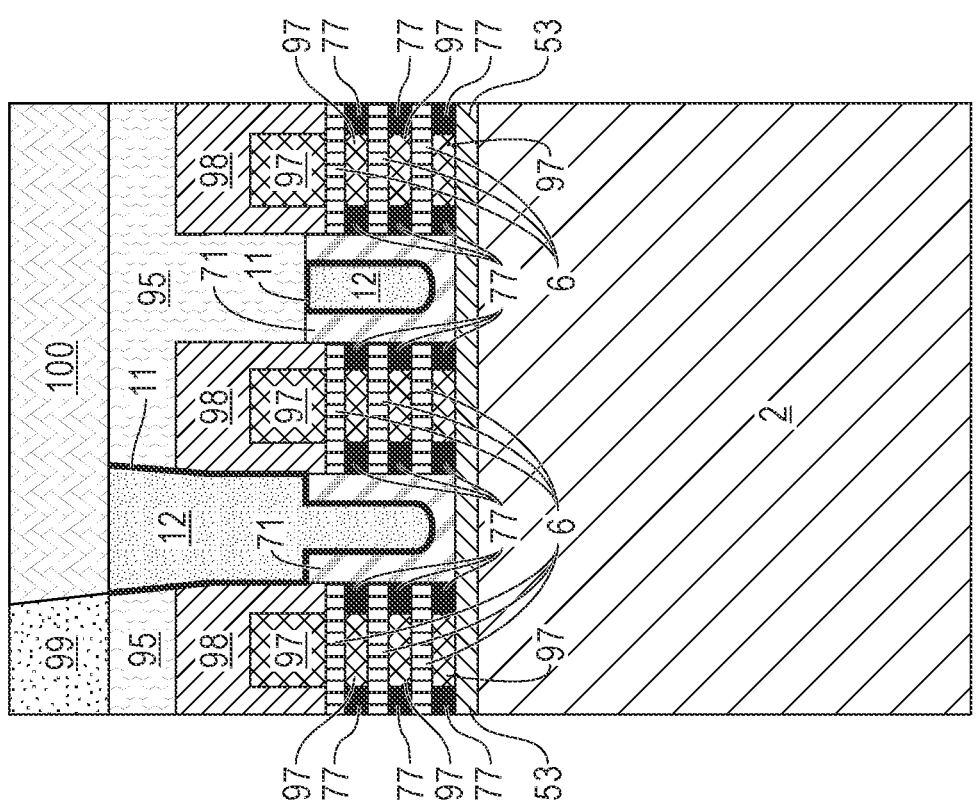
FIG. 19A depicts a cross-sectional view of section A-A of a nineteenth semiconductor structure after fabrication steps removing dummy gate structure and replacing with a metal gate structure, in accordance with an embodiment of the present invention.

FIG. 19A depicts a cross-sectional view of section A-A of a nineteenth semiconductor structure after forming M0 100, in accordance with an embodiment of the present invention. To form M0 100, OPL 85 can be removed, for example, by plasma ash or CMP, and a layer of ILD 99 deposited and patterned. A layer of metal, such as copper, for a first metal layer (i.e., M0 100) is deposited. A CMP can be performed to remove portions of M0 100 on ILD 99 to complete M0 100 formation. In FIG. 19A, the leftmost S/D 71 of a semiconductor device connects to M0 100.

FIG. 19B depicts a cross-sectional view of section B-B of the nineteenth semiconductor structure after forming a first metal layer, M0 100, in accordance with an embodiment of the present invention. Using the steps described above, ILD 99 can fill the trench in ILD 95 above the wraparound contact formed by contact liner 11 and contact 12 above the connection of contact 12 to BPR 32. M0 100 can be formed using known semiconductor processes to form metal layers for interconnections by depositing and selectively etching a second layer of ILD 99 and depositing M0 100 followed by CMP. As depicted in FIG. 19B, the leftmost S\D 71 connects metal contact 12 and contact liner 11 directly to a portion of the top surface of BPR 32. The leftmost metal contact 12 can be a wraparound buried contact to the buried power rail (BPR 32). The rightmost metal contact 12, as depicted, connects rightmost S/D 71 of the semiconductor device, to M0 100, where M0 100 can be a first metal layer of the interconnect layers of a semiconductor structure that will, upon completion of additional steps (not included in discussion here), form a semiconductor chip.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure with a buried power rail, the structure comprising:
   a buried power rail in a semiconductor substrate; and
   a buried contact contacting a first portion of a top surface of the buried power rail to a source/drain of a semiconductor device, wherein a first portion of a top surface of the buried contact is below a top surface of the source/drain of the semiconductor device and a portion of a bottom surface of the buried contact is in a cavity formed in the source/drain of the semiconductor device.

2. The semiconductor structure of claim 1,
   wherein the first portion of the top surface of the buried power rail is below a top surface of the semiconductor substrate, and wherein the buried power rail is surrounded by a liner extending above the top surface of the semiconductor substrate to a portion of the source/drain of the semiconductor device.

3. The semiconductor structure of claim 1, wherein a dielectric material is over a second portion of the top surface of the buried power rail abutting the buried contact.

4. The semiconductor structure of claim 2, wherein the buried contact fills an L-shaped cavity in the source/drain, wherein the buried contact is over the first portion of the buried power rail, over a portion of the liner, and over the source/drain of the semiconductor device.

5. The semiconductor structure of claim 1, wherein a second portion of the top surface of the buried contact is level with the top surface of the source/drain of the semiconductor device.

6. The semiconductor structure of claim 5, wherein a portion of the buried contact is removed above the first portion of the top surface of the buried contact.

7. The semiconductor structure of claim 1, wherein the source/drain of the semiconductor device is L-shaped with a longer leg extending parallel to a top surface of the semiconductor substrate.

8. The semiconductor structure of claim 7, wherein a spacer is under the source/drain of the semiconductor device and along vertical side of the source/drain of the semiconductor device.

9. The semiconductor structure of claim 1, wherein the buried contact includes a metal liner.

10. A semiconductor structure with a buried power rail, the structure comprising:
   a buried power rail in a semiconductor substrate, wherein a top surface of the buried power rail is below a top surface of the semiconductor substrate, and wherein a liner surrounds the buried power rail extending above the top surface of the semiconductor substrate;
   a first portion of a first contact connecting to a first portion of the top surface of the buried power rail abuts a shallow isolation trench on a second portion of the top surface of the buried power rail; and
   the first contact is over the first portion of the top surface of the buried power rail, over a left portion of the liner adjacent to a first source/drain, and over the first source/drain, wherein a second portion of the first contact that is over the first portion of the top surface of the buried power rail is removed.

11. The semiconductor structure of claim 10, further comprising:
   a second source/drain on a portion of a first spacer on the semiconductor substrate is adjacent to a right portion of the liner surrounding the buried power rail, wherein the right portion of the liner is adjacent to the isolation trench on the second portion of the top surface of the buried power rail buried power rail; and
   a second contact is in the second source/drain connecting to a first metal layer of an interconnect layer of the semiconductor structure.

12. The semiconductor structure of claim 11, wherein the first source/drain is an L-shaped source/drain and the second source/drain is U-shaped, wherein the L-shaped source/drain has a long leg of the L-shaped source/drain extending parallel to the top surface of the semiconductor substrate from the liner and a short leg of the L-shaped source/drain extends vertically to form a cavity in the first source/drain adjacent to the buried power rail.

13. The semiconductor structure of claim 11, wherein one or more metal gate structures extend in perpendicular direction to the buried power rail on a first spacer material above the semiconductor substrate.

14. The semiconductor structure of claim 11, wherein one or more layers of a semiconductor material bisect one or more metal gate structures, wherein in one or more second spacers reside under a portion of each of the one or more layers of the semiconductor material between the metal gate structure and one of the first source/drain or the second source/drain.

15. The semiconductor structure of claim 13, wherein the first spacer material is under the first source/drain, the second source/drain, the one or more gate structures, and covers outside vertical sides of the first source/drain and the second source/drain.

16. The semiconductor structure of claim 15, wherein the first spacer material and one or more second spacers are composed of different dielectric materials.

17. The semiconductor structure of claim 11, wherein an interlayer dielectric material is over a top surface of the first contact, over a portion of the second contact, a portion of a top surface of the first source/drain, over a top surface of a portion of the second source/drain, and over the shallow isolation trench on the second portion of the top surface of the buried power rail.

18. The semiconductor structure of claim 11, wherein the first source/drain and the second source/drain are formed with an epitaxial growth process.

19. The semiconductor structure of claim 10, wherein the second portion of the first contact over the first portion of the top surface of the buried power rail is removed to reduce capacitance of the first contact and improve electrical performance.

* * * * *